(12) United States Patent
Hou et al.

(10) Patent No.: US 12,476,609 B2
(45) Date of Patent: Nov. 18, 2025

(54) RESONATOR AND MANUFACTURING METHOD THEREOF, FILTER, AND ELECTRONIC DEVICE

(71) Applicant: Huawei Technologies Co., Ltd., Shenzhen (CN)

(72) Inventors: Hangtian Hou, Shanghai (CN); Bo Du, Shenzhen (CN); Peng Liu, Shenzhen (CN); Zongzhi Gao, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 302 days.

(21) Appl. No.: 18/187,846

(22) Filed: Mar. 22, 2023

(65) Prior Publication Data
US 2023/0231537 A1 Jul. 20, 2023

Related U.S. Application Data

(63) Continuation of application No. PCT/CN2020/117230, filed on Sep. 23, 2020.

(51) Int. Cl.
*H03H 9/17* (2006.01)
*H03H 3/02* (2006.01)
*H03H 9/56* (2006.01)

(52) U.S. Cl.
CPC .............. *H03H 9/175* (2013.01); *H03H 3/02* (2013.01); *H03H 9/564* (2013.01); *H03H 9/568* (2013.01); *H03H 2003/025* (2013.01)

(58) Field of Classification Search
CPC ...... H03H 9/175; H03H 3/02; H03H 9/02157; H03H 9/568; H03H 9/564; H03H 9/605; H03H 9/02118; H03H 2003/025
See application file for complete search history.

(56) References Cited

U.S. PATENT DOCUMENTS

| 8,198,958 | B1* | 6/2012 | Aigner | H03H 9/585 |
| | | | | 333/191 |
| 9,985,194 | B1* | 5/2018 | Tajic | H03H 3/02 |
| 2010/0005654 | A1 | 1/2010 | Hart et al. | |
| 2012/0218058 | A1 | 8/2012 | Burak et al. | |
| 2013/0038408 | A1 | 2/2013 | Burak et al. | |
| 2013/0278356 | A1* | 10/2013 | Meltaus | H03H 9/547 |
| | | | | 333/187 |
| 2014/0273881 | A1* | 9/2014 | Tajic | H03H 9/703 |
| | | | | 29/25.35 |
| 2020/0099359 | A1* | 3/2020 | Shin | H03H 9/02118 |
| 2020/0169245 | A1 | 5/2020 | Matsuda et al. | |

FOREIGN PATENT DOCUMENTS

CN 109889179 A 6/2019

* cited by examiner

*Primary Examiner* — Quan Tra
(74) *Attorney, Agent, or Firm* — Slater Matsil, LLP

(57) ABSTRACT

Disclosed are a resonator and a manufacturing method thereof, a filter, and an electronic device. The resonator includes a substrate, a Bragg reflection layer, and a piezoelectric layer that are sequentially stacked. A first electrode is disposed on a surface that is of the piezoelectric layer and that faces the Bragg reflection layer, a second electrode is disposed on a surface that is of the piezoelectric layer and that is away from the Bragg reflection layer, a border ring is disposed on a surface that is of the second electrode and that is away from the piezoelectric layer, and the resonator has a first resonance region and a second resonance region corresponding to the border ring.

20 Claims, 22 Drawing Sheets

RESONATOR AND MANUFACTURING METHOD THEREOF, FILTER, AND ELECTRONIC DEVICE

CROSS-REFERENCE TO RELATED APPLICATIONS

This application is a continuation of International Application No. PCT/CN2020/117230, filed on Sep. 23, 2020, the disclosure of which is hereby incorporated by reference in its entirety.

TECHNICAL FIELD

This application relates to the field of filter technologies, and in particular, to a resonator and a manufacturing method thereof, a filter, and an electronic device.

BACKGROUND

Resonators are widely used in radio frequency filters of electronic devices such as mobile phones due to advantages of high performance, a small size, and strong power tolerance. With development of 5G technologies, there is an increasing demand for filters.

Currently, to improve a quality factor (Q), a border ring (border ring or frame ring) is disposed on a commonly used resonator. Existence of the border ring introduces a border mode (border mode or frame mode) harmonic into a waveform of the filter, and the border mode harmonic greatly affects performance of the filter. This problem needs to be resolved urgently.

SUMMARY

This application provides a resonator and a manufacturing method thereof, a filter, and an electronic device, to reduce impact of a border ring on a filter channel.

According to a first aspect, this application provides a resonator. The resonator includes a substrate, a Bragg reflection layer, and a piezoelectric layer that are sequentially stacked. A first electrode is disposed on a surface that is of the piezoelectric layer and that faces the Bragg reflection layer, and a second electrode is disposed on a surface that is of the piezoelectric layer and that is away from the Bragg reflection layer. A border ring is disposed on a surface that is of the second electrode and that is away from the piezoelectric layer, and existence of the border ring changes resonant frequency distribution of an acoustic wave in the resonator, so that an effective resonance region of the entire resonator includes a first resonance region and a second resonance region. The first resonance region is a resonance region in which no border ring is disposed in the resonator, and the second resonance region is a resonance region corresponding to the border ring. The border ring herein may relatively improve a quality factor of the entire resonator. Along the foregoing stacking direction, the Bragg reflection layer includes a low acoustic-impedance structure and a first high acoustic-impedance structure embedded in the low acoustic-impedance structure, where the first high acoustic-impedance structure is provided with a discontinuous structure. The discontinuous structure corresponds to the second resonance region, and the discontinuous structure herein is configured to suppress a border mode harmonic. The stacking direction herein should be understood as a direction for sequentially passing through the stacked layers, and may be understood as an axial direction, for example, a direction for passing through the entire resonator from the bottom of the substrate to the top of the piezoelectric layer. The first high acoustic-impedance structure is a plate structure, and a ratio of a radial size of the first high acoustic-impedance structure to a circumferential size of the first high acoustic-impedance structure is relatively large. The first high acoustic-impedance structure is embedded in the low acoustic-impedance structure, to be specific, in addition to being covered by the low acoustic-impedance structure in the stacking direction (equivalent to an axial direction), the first high acoustic-impedance structure is also surrounded by the low acoustic-impedance structure around a radial direction. This is equivalent to that the low acoustic-impedance structure and the first high acoustic-impedance structure are disposed alternately along the stacking direction, and are configured to reflect an acoustic wave. In addition, the first high acoustic-impedance structure has the discontinuous structure, so that thicknesses of parts of the first high acoustic-impedance structure are different, thereby affecting propagation of an acoustic wave. Through proper design of the first high acoustic-impedance structure, a reflection state of an acoustic wave in the Bragg reflection layer can be changed.

In the foregoing resonator, the first high acoustic-impedance structure provided with the discontinuous structure is formed, so that a reflection state of an acoustic wave in the Bragg reflection layer can be changed. Through proper structure design of the first high acoustic-impedance structure, a border mode harmonic brought by the border ring can be suppressed, and a quality factor of the resonator can be maintained. In addition, a process of manufacturing the first high acoustic-impedance structure provided the discontinuous structure is low in complexity, and the process is highly feasible.

In a possible implementation, the discontinuous structure disposed in the first high acoustic-impedance structure overlaps the second resonance region and does not overlap the first resonance region. In other words, the discontinuous structure corresponds to a border ring structure.

A specific implementation of the first high acoustic-impedance structure provided with the discontinuous structure may be: disposing a groove on a surface of the first high acoustic-impedance structure, where the groove is disposed on the surface of the first high acoustic-impedance structure, the surface may be a surface that is of the first high acoustic-impedance structure and that faces the piezoelectric layer, or may be a surface that is of the first high acoustic-impedance structure and that faces the substrate, and the groove may be disposed on only any surface of the first high acoustic-impedance structure, or the groove may be disposed on each of the two surfaces of the first high acoustic-impedance structure. A specific implementation of the first high acoustic-impedance structure having the discontinuous structure may alternatively be: disposing a step on an edge of the first high acoustic-impedance structure, where along a plane perpendicular to the stacking direction, a bottom surface of the step may face the piezoelectric layer, or the bottom surface of the step may face the substrate. Specifically, when the bottom surface of the step faces the piezoelectric layer or the bottom surface of the step faces the substrate, in a plane perpendicular to the edge, a horizontal size of the step is greater than 200 nm and less than a distance between the edge and an edge of the first resonance region, and a vertical size of the step is greater than 20 nm and less than a thickness of the first high acoustic-impedance structure. The horizontal size should be understood as a size along the radial direction, and the vertical size should be understood as a size along the stacking direction.

A material of the low acoustic-impedance structure may include a dielectric material such as $SiO_2$ (silicon dioxide) or SiN (silicon nitride), and a material of the first high acoustic-impedance structure may include a metal material such as W (tungsten), Mo (molybdenum), or Ru (ruthenium), or a dielectric material such as AlN (aluminum nitride) or $Ta_2O_5$ (tantalum pentoxide).

In a possible implementation, the step is disposed on each of two edges that are of the first high acoustic-impedance structure and that are located in a same plane perpendicular to the stacking direction. In the plane perpendicular to the edges, the steps have different horizontal sizes, and the steps have a same vertical size.

It should be understood that the Bragg reflection layer in this application may further include a second high acoustic-impedance structure embedded in the low acoustic-impedance structure. The second high acoustic-impedance structure is similar to the first high acoustic-impedance structure, and along the stacking direction, the second high acoustic-impedance structure is parallel to the first high acoustic-impedance structure, which is equivalent to that the low acoustic-impedance structure is disposed between the second high acoustic-impedance structure and the first high acoustic-impedance structure. Certainly, another third high acoustic-impedance structure, fourth high acoustic-impedance structure, and the like may be further included. All the high acoustic-impedance structures are sequentially distributed in parallel in a direction pointing from the piezoelectric layer to the substrate, and sizes that are of the high acoustic-impedance structures and that are perpendicular to the stacking direction gradually increase in the direction pointing from the piezoelectric layer to the substrate.

When the Bragg reflection layer in this application includes at least two high acoustic-impedance structures (for example, including the first high acoustic-impedance structure and the second high acoustic-impedance structure, or including the first high acoustic-impedance structure, the second high acoustic-impedance structure, and the third high acoustic-impedance structure, or including the first high acoustic-impedance structure, the second high acoustic-impedance structure, the third high acoustic-impedance structure . . . , and so on), a structure of the resonator provided in this application may be described in a summary manner as follows: The resonator provided in this application includes a substrate, a Bragg reflection layer, and a piezoelectric layer that are sequentially stacked. A first electrode is disposed on a surface that is of the piezoelectric layer and that faces the Bragg reflection layer, a second electrode is disposed on a surface that is of the piezoelectric layer and that is away from the Bragg reflection layer, a border ring is disposed on a surface that is of the second electrode and that is away from the piezoelectric layer, and the resonator has a first resonance region and a second resonance region corresponding to the border ring. Along a stacking direction, the Bragg reflection layer includes a low acoustic-impedance structure and N high acoustic-impedance structures embedded in the low acoustic-impedance structure, where N herein is an integer greater than or equal to 1. The N high acoustic-impedance structures are all plate structures, a ratio of a radial size of each high acoustic-impedance structure to a circumferential size of the high acoustic-impedance structure is relatively large, and the N high acoustic-impedance structures are parallel to each other along the stacking direction. The N high acoustic-impedance structures are embedded in the low acoustic-impedance structure, to be specific, in addition to being covered by the low acoustic-impedance structure in the stacking direction (equivalent to an axial direction), each high acoustic-impedance structure is also surrounded by the low acoustic-impedance structure around a radial direction. This is equivalent to that the low acoustic-impedance structure and the N high acoustic-impedance structures are disposed alternately along the stacking direction, and are configured to reflect an acoustic wave. At least one high acoustic-impedance structure is provided with a discontinuous structure corresponding to the second resonance region.

According to a second aspect, based on the structure of the foregoing resonator, this application further provides a method for manufacturing a resonator, which is used to manufacture the foregoing resonator. The resonator has a first resonance region and a second resonance region, and the method for manufacturing the resonator specifically includes the following steps: providing a substrate; disposing a Bragg reflection layer on the substrate, where along a stacking direction, the Bragg reflection layer includes a low acoustic-impedance structure and a first high acoustic-impedance structure embedded in the low acoustic-impedance structure, and the first high acoustic-impedance structure is provided with a discontinuous structure corresponding to the second resonance region; disposing a piezoelectric layer on a surface of the Bragg reflection layer, where a first electrode is disposed on a surface that is of the piezoelectric layer and that faces the Bragg reflection layer, and a second electrode is disposed on a surface that is of the piezoelectric layer and that is away from the Bragg reflection layer; and disposing a border ring on a surface that is of the second electrode and that is away from the piezoelectric layer. Manufacturing of the border ring changes a size of the entire resonator in the stacking direction, so that the resonator has the first resonance region and the second resonance region corresponding to the border ring. The first resonance region and the second resonance region herein jointly form an effective resonance region of the resonator.

Based on different implementations of the discontinuous structure in the first high acoustic-impedance structure, the Bragg reflection layer may be disposed on the substrate in different manners.

Manner 1: The disposing a Bragg reflection layer on the substrate may include the following steps:

depositing a low acoustic-impedance material on the substrate to form a first low acoustic-impedance layer;

depositing a high acoustic-impedance material on a surface of the first low acoustic-impedance layer to form the first high acoustic-impedance structure;

patterning the first high acoustic-impedance structure, where this step means disposing a discontinuous structure such as a groove or a step on a surface of a high acoustic-impedance structure;

depositing a low acoustic-impedance material on a surface of the first high acoustic-impedance structure to form a second low acoustic-impedance layer covering the first low acoustic-impedance layer;

flattening the second low acoustic-impedance layer, so that a surface of the second low acoustic-impedance layer is flush with a surface of the first high acoustic-impedance structure, where a chemical-mechanical polishing process may be used herein; and disposing a low acoustic-impedance material on the surfaces of the second low acoustic-impedance layer and the first high acoustic-impedance structure to form a third low acoustic-impedance layer, where the third low acoustic-impedance layer, the second low acoustic-impedance layer, and the first low acoustic-impedance layer have an integrated structure to form the low acoustic-impedance structure.

Manner 2: The disposing a Bragg reflection layer on the substrate may include the following steps:
  depositing a low acoustic-impedance material on the substrate to form a first low acoustic-impedance layer;
  depositing a high acoustic-impedance material on a surface of the first low acoustic-impedance layer to form a first high acoustic-impedance layer;
  depositing a low acoustic-impedance material around the first high acoustic-impedance layer, so that the surface of the first low acoustic-impedance layer is flush with a surface of the first high acoustic-impedance layer;
  disposing a high acoustic-impedance material on the surfaces of the first low acoustic-impedance layer and the first high acoustic-impedance layer to form a second high acoustic-impedance layer, where the second high acoustic-impedance layer and the first high acoustic-impedance layer have an integrated structure to form the first high acoustic-impedance structure, and a structure difference between the second high acoustic-impedance layer and the first high acoustic-impedance layer may form the discontinuous structure;
  depositing a low acoustic-impedance material on a surface of the second high acoustic-impedance layer to form a second low acoustic-impedance layer covering the second high acoustic-impedance layer;
  flattening the second low acoustic-impedance layer, so that a surface of the second low acoustic-impedance layer is flush with the surface of the second high acoustic-impedance layer, where a chemical-mechanical polishing process may be used herein; and
  disposing a low acoustic-impedance material on the surfaces of the second low acoustic-impedance layer and the second high acoustic-impedance layer to form a third low acoustic-impedance layer, where the first low acoustic-impedance layer, the second low acoustic-impedance layer, and the third low acoustic-impedance layer have an integrated structure, and the three low acoustic-impedance layers jointly form the low acoustic-impedance structure.

It should be understood that the method for manufacturing a resonator herein is intended to manufacture a resonator having only the first high acoustic-impedance structure. When the resonator further has a second high acoustic-impedance structure or even more high acoustic-impedance structures, the foregoing manufacturing method is correspondingly adjusted, but basic steps remain unchanged. Details are not described herein.

According to a third aspect, based on the structure of the foregoing resonator, this application further provides a filter of a trapezoidal structure, which specifically includes an input terminal, an output terminal, a series branch, a first parallel branch, and a first filter unit. One end of the series branch is connected to the input terminal, and the other end is connected to the output terminal. One end of the first parallel branch is connected to the series branch, and the other end is grounded. The first filter unit includes a first series resonator disposed on the series branch and a first parallel resonator disposed on the first parallel branch. The first series resonator is provided with a structure configured to suppress a border mode harmonic.

In a possible implementation, the first series resonator may have a same structure as the resonator provided in the first aspect. To be specific, the first series resonator includes a substrate, a Bragg reflection layer, and a piezoelectric layer that are sequentially stacked, where a first electrode is disposed on a surface that is of the piezoelectric layer and that faces the Bragg reflection layer, a second electrode, a first resonance region, and a second resonance region are disposed on a surface that is of the piezoelectric layer and that is away from the Bragg reflection layer, and a border ring is disposed on a surface that is of the second electrode and that is away from the piezoelectric layer, so that the first series resonator has the first resonance region and the second resonance region corresponding to the border ring, Along a stacking direction, the Bragg reflection layer includes a low acoustic-impedance structure and a first high acoustic-impedance structure embedded in the low acoustic-impedance structure, where the first high acoustic-impedance structure has a discontinuous structure corresponding to the second resonance region, and is configured to suppress a border mode harmonic. Because the first series resonator can suppress a border mode harmonic, a passband of the filter can be improved. The first parallel resonator herein may also have a same structure as the resonator provided in the first aspect, and details are not described herein again.

It can be understood that the filter herein may further include a second parallel branch and a second filter unit. One end of the second parallel branch is connected to the series branch, and the other end is grounded. The second filter unit includes a second series resonator connected on the series branch and a second parallel resonator connected on the second parallel branch. The second series resonator is connected in series to the first series resonator, and the second parallel resonator is connected in parallel to the first parallel resonator. Similar to that in the first filter unit, in the second filter unit, the second series resonator may have a same structure as the resonator provided in the first aspect, and the second parallel resonator may also have a same structure as the resonator provided in the first aspect.

According to a fourth aspect, based on the structure of the foregoing filter, this application further provides an electronic device. The electronic device may include a transceiver, a memory, and a processor, and the filter is disposed in the transceiver.

DETAILED DESCRIPTION OF ILLUSTRATIVE EMBODIMENTS

Figure 1A:
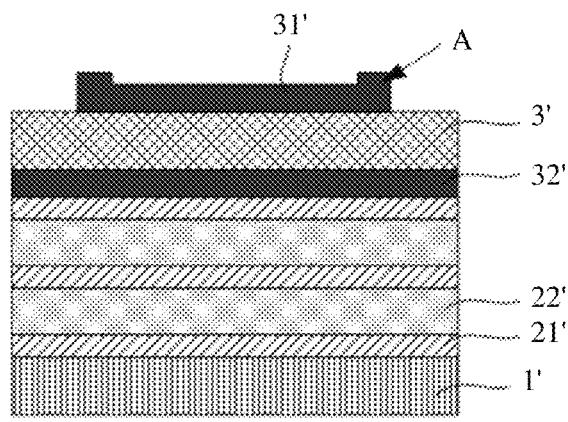
FIG. 1A is a schematic diagram of a structure of a solidly mounted resonator in the conventional technology.
Figure 1B:
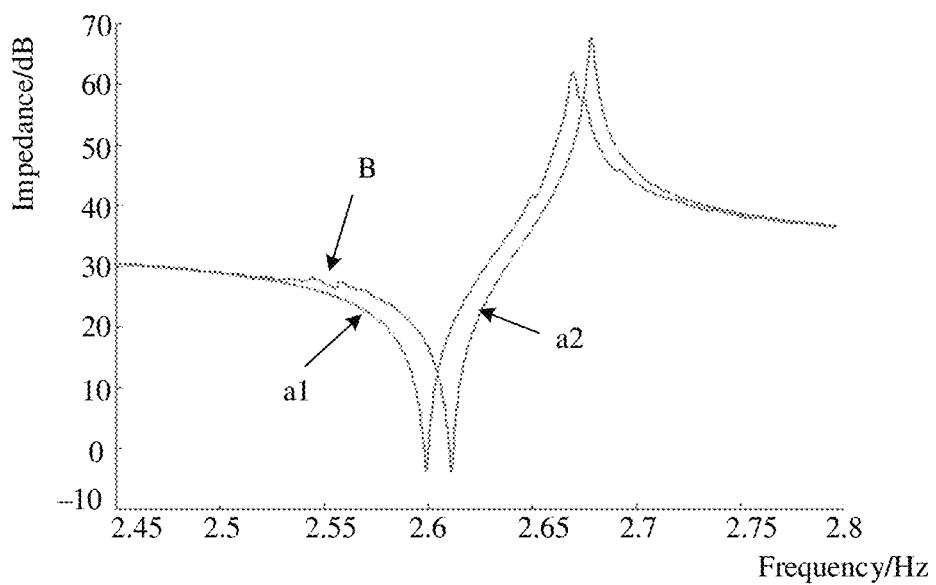
FIG. 1B is a diagram of an impedance waveform of a solidly mounted resonator in the conventional technology.
Figure 1C:
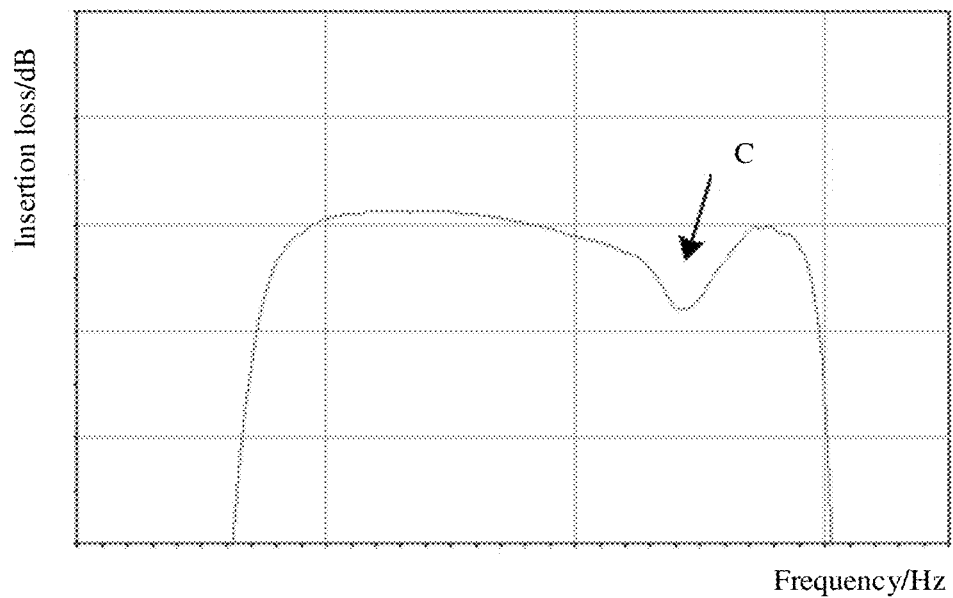
FIG. 1C is a diagram of a passband waveform of a filter in the conventional technology.

Piezoelectric thin-film bulk acoustic resonators are widely used in filters of electronic devices such as mobile phones. Currently, mainstream piezoelectric thin-film bulk acoustic wave resonators mainly include a thin-film free-standing bulk acoustic resonator (FBAR) and a solidly mounted resonator (SMR). The solidly mounted resonator uses a high acoustic-impedance structure and a low acoustic-impedance structure to form a Bragg reflection layer to reflect an acoustic wave and limit energy. A structure of a solidly mounted resonator shown in FIG. 1A is used as an example. The solidly mounted resonator includes a substrate 1', a Bragg reflection layer 2' (including a low acoustic-impedance layer 21' and a high acoustic-impedance layer 22' that are stacked), and a piezoelectric layer 3'. An upper electrode 31' is disposed on a side that is of the piezoelectric layer 3' and that is away from the Bragg reflection layer 2', and a lower electrode 32' is disposed on a side that is of the piezoelectric layer 3' and that faces the Bragg reflection layer 2'. To improve a quality factor (Q) of the resonator and suppress a horizontal harmonic, a border ring A is disposed on the upper electrode 31' of the solidly mounted resonator, so that the resonator has different thicknesses in different locations. Specifically, a resonator part in which the border ring A is disposed has a relatively large thickness, and a vibration frequency of a sound propagated in the resonator part is relatively low. A resonator part in which the border ring A is not disposed has a relatively small thickness, and a vibration frequency of a sound propagated in the resonator part is relatively high. Such a vibration frequency difference is shown in FIG. 1B. A border mode harmonic B including one or even more resonances is introduced before a resonance waveform a2 of the resonator, and a1 is a resonance waveform of the solidly-mounted resonator to which the border ring A is not added (herein, frequencies of a1 and a2 are shifted by 10 MHz to obtain clearer comparison and distinguishing effect). As shown in a waveform of a filter in FIG. 1C, introduction of the border mode harmonic B causes fluctuation of a passband of the filter, and even causes deterioration of the passband of the filter (a location shown by C in FIG. 1C).

Therefore, the embodiments of this application provide a resonator to reduce the foregoing impact.

To make the objectives, technical solutions, and advantages of this application clearer, the following further describes this application in detail with reference to the accompanying drawings.

Terms used in the following embodiments are merely intended to describe specific embodiments, but are not intended to limit this application. As used in this specification and the appended claims of this application, the terms "one", "a", "the", "the foregoing", and "this" of singular forms are also intended to include expressions such as "one or more", unless opposite indication is explicitly described in the context.

Reference to "an embodiment", "some embodiments", or the like described in this specification indicates that one or more embodiments of this application include a specific feature, structure, or characteristic described with reference to the embodiment. Therefore, statements such as "in an embodiment", "in some embodiments", and "in some other embodiments" that appear at different places in this specification do not necessarily refer to a same embodiment. Instead, the statements mean "one or more but not all of the embodiments", unless otherwise specifically emphasized in another manner. The terms "include", "contain", "have", and their variants all mean "including but not limited to", unless otherwise specifically emphasized in another manner.

Figure 2:
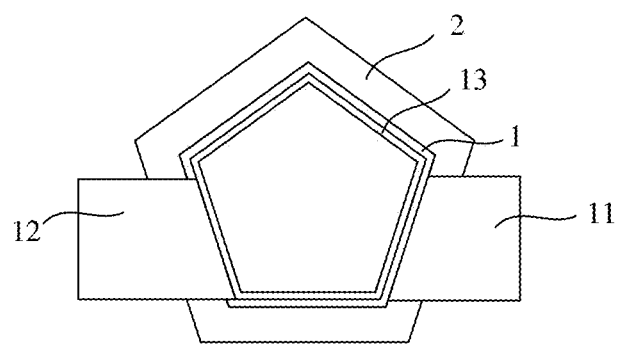
FIG. 2 is a top view of a resonator according to an embodiment of this application.

First, referring to a resonator that is shown in FIG. 2 and that is provided in an embodiment of this application, FIG. 2 is a schematic diagram of a top view of the resonator. It can be learned that the resonator is shown in a pentagonal structure. FIG. 2 shows parts of a piezoelectric layer 1 and a Bragg reflection layer 2 of the resonator. Certainly, the resonator further includes a substrate 3 disposed at the bottom of the Bragg reflection layer 2. Generally, a structure of the substrate 3 matches a structure of the Bragg reflection layer 2. Therefore, from a perspective of FIG. 2, the substrate 3 is shielded by the Bragg reflection layer 2 herein and is not shown, and the substrate 3 is shown in a subsequent drawing. Still referring to FIG. 2, a first electrode 11 and a second electrode 12 are disposed in the piezoelectric layer 1, and a border ring 13 is disposed on a surface of the second electrode 12. It can be learned that a shape of the border ring 13 matches a shape of the piezoelectric layer 1 and is pentagon-shaped. It can be understood that the border ring 13 in FIG. 2 is illustrated by using a continuous and uninterrupted annular structure. Certainly, the border ring 13 may be discontinuous or interrupted, and this does not affect implementation of effect of this embodiment of this application. Herein, only the border ring 13 in FIG. 2 is used as an example for description.

Figure 3A:
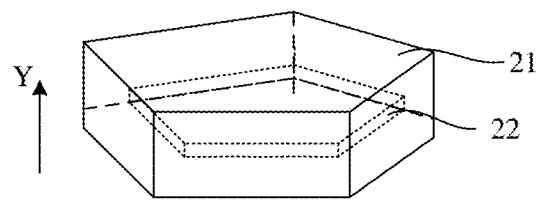
FIG. 3A is a schematic diagram of a structure of a Bragg reflection layer in a resonator according to an embodiment of this application.

For the structure of the Bragg reflection layer 2, refer to an illustration in FIG. 3A. The Bragg reflection layer 2 includes a low acoustic-impedance structure 21 and a first high acoustic-impedance structure 22 embedded in the low acoustic-impedance structure 21. The first high acoustic-impedance structure 22 is embedded in the low acoustic-impedance structure 21, to be specific, in addition to the low acoustic-impedance structure 21 in a stacking direction, the first high acoustic-impedance structure 22 is also surrounded by the low acoustic-impedance structure 21 around a radial direction. It can be learned that shapes of the first high acoustic-impedance structure 22 and the low acoustic-impedance structure 21 are similar to a shape of the entire Bragg reflection layer 2, and both are perpendicular to a Y direction and have a pentagonal cross section, that is, match the structure of the border ring 13.

It should be understood that both the low acoustic-impedance structure 21 and the first high acoustic-impedance structure 22 are specific to a parameter "acoustic impedance". The impedance refers to resistance that needs to be overcome to shift a dielectric. The acoustic impedance herein may be defined as "sound pressure/a speed at which a dielectric flows through an area", or may be represented as "a product of a dielectric density and an acoustic speed". The low acoustic-impedance structure 21 is a structure made of a material having a relatively low acoustic impedance, and the first high acoustic-impedance structure 22 is a structure made of a material having a relatively high acoustic impedance. High and low of the acoustic impedance are relative with receptive to the low acoustic-impedance structure 21 and the first high acoustic-impedance structure 22. In this embodiment of this application, the material of the low acoustic-impedance structure 21 may include a dielectric material such as $SiO_2$ or SiN, and the material of the first high acoustic-impedance structure 22 may include a metal material such as W, Mo, or Ru, or a dielectric material such as AlN or $Ta_2O_5$.

Figure 3B:
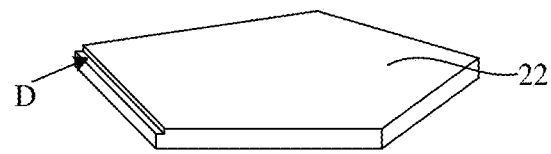
FIG. 3B is a schematic diagram of a structure of a first high acoustic-impedance structure in a resonator according to an embodiment of this application.

A structure of a resonator shown in FIG. 3B is used as an example. For example, as shown in FIG. 3B, a step D is disposed on an edge of the first high acoustic-impedance structure 22, and the step D is equivalent to a discontinuous structure that makes a surface of the first high acoustic-impedance structure 22 discontinuous. The resonator provided in this embodiment of this application may be sectioned by using a plane perpendicular to the edge having the step D, to obtain an illustration of a cross-section structure of the resonator shown in FIG. 3C (it should be understood that FIG. 3C shows merely an example of a correspondence between structures of the resonator in a cross-section state, and does not completely correspond to structure details in FIG. 2).

Figure 3C:
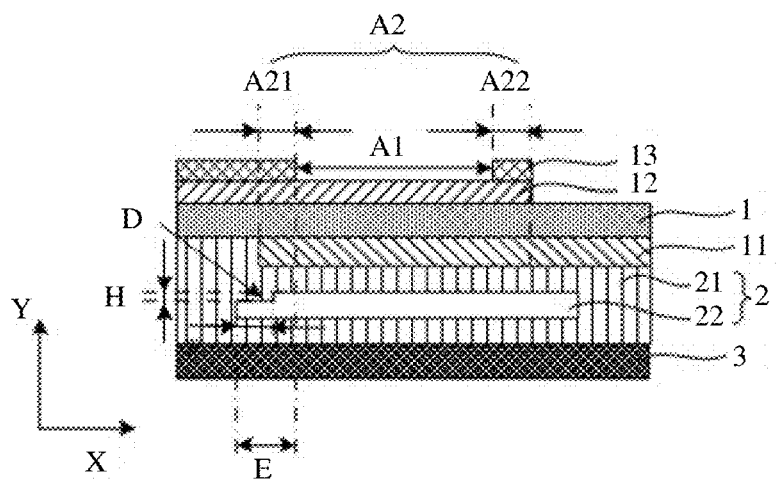
FIG. 3C is a schematic diagram of a cross-section structure of a resonator according to an embodiment of this application.

Referring to FIG. 3C, the resonator includes a substrate 3, a Bragg reflection layer 2, and a piezoelectric layer 1 that are sequentially stacked in a specific direction (a Y direction in FIG. 3B). A first electrode 11 is disposed on a surface that is of the piezoelectric layer 1 and that faces the Bragg reflection layer 2, a second electrode 12 is disposed on a surface that is of the piezoelectric layer 1 and that is away from the Bragg reflection layer 2, and a border ring 13 is disposed on a surface that is of the second electrode 12 and that is away from the piezoelectric layer 1. The second electrode 12 herein is located on a surface of the resonator, and the first electrode 11 is equivalent to being pressed on a side that is of the piezoelectric layer 1 and that faces the Bragg reflection layer 2.

Figure 3D:
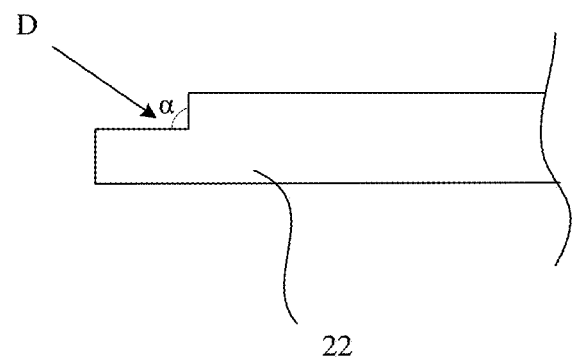
FIG. 3D is a schematic diagram of a partial structure of a first high acoustic-impedance structure in a resonator according to an embodiment of this application.

In FIG. 3C, the resonator has a first resonance region A1 and a second resonance region A2. The first resonance region A1 and the second resonance region A2 jointly form an effective resonance region of the entire resonator. The two resonance regions obtained through division both are space corresponding to a stacking direction of the layers of structures of the resonator, and the second resonance region A2 corresponds to the border ring 13. It should be understood that the "corresponding" refers to corresponding to three-dimensional space formed by a projection range of the border ring 13 in the entire resonator along the stacking direction. When the border ring 13 is of an annular structure, the second resonance region A2 should also be of an annular structure. In a state shown in FIG. 3C, the second resonance region A2 is shown by a region A21 and a region A22. Still referring to FIG. 3C, a step D is disposed on a left edge of the first high acoustic-impedance structure 22. It should be understood that from a perspective shown in FIG. 3C, along a direction perpendicular to the stacking direction (that is, a Y direction in FIG. 3C), a bottom surface (a surface parallel to an X direction) of the step D faces the piezoelectric layer 1. Using the edge as a reference, in a plane perpendicular to the edge, a horizontal size W (that is, a size along the X direction in FIG. 3C) of the step D is greater than 200 nm and less than a distance E between the edge and an edge of the first resonance region A1, and a vertical size H (that is, a size along the Y direction in FIG. 3C) of the step D is greater than 20 nm and less than a thickness of the first high acoustic-impedance structure 22. Referring to a schematic diagram of a partial structure of the first high acoustic-impedance structure 22 shown in FIG. 3D, a step D is disposed on an edge of the first high acoustic-impedance structure 22. Considering a process limitation, an angle α between a side surface and a bottom surface of the step D may be set to 90°+30°.

Figure 3E:
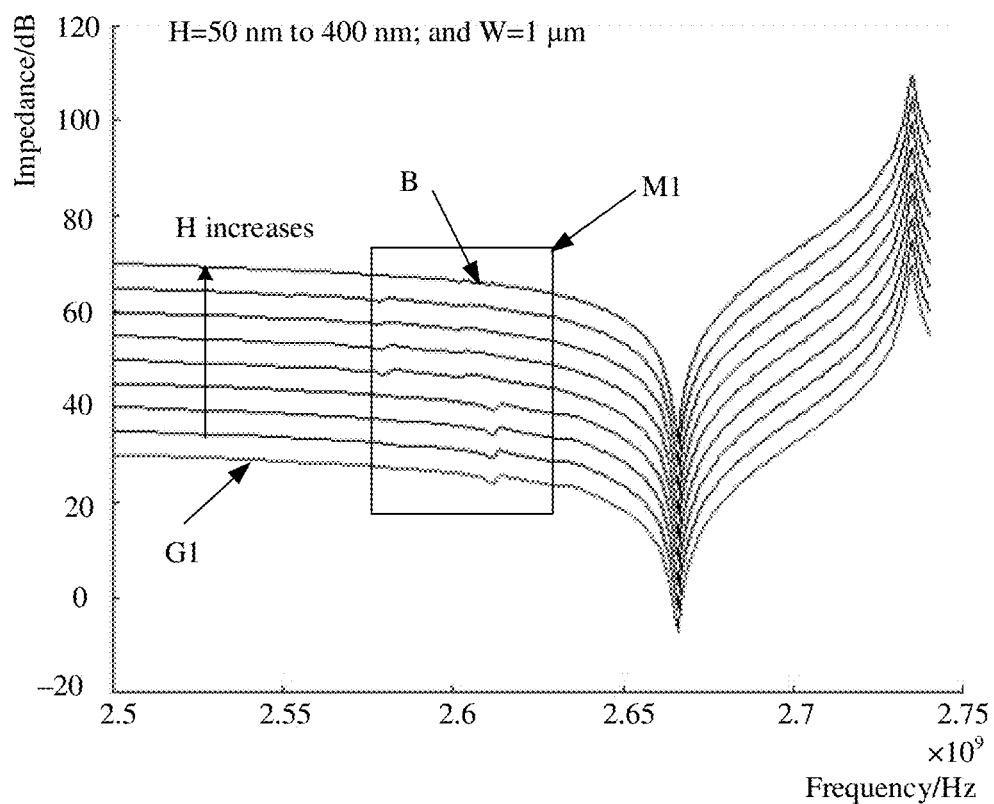
FIG. 3E is a schematic diagram of impedance waveform simulation for a resonator provided in an embodiment of this application and a resonator in the conventional technology.
Figure 3F:
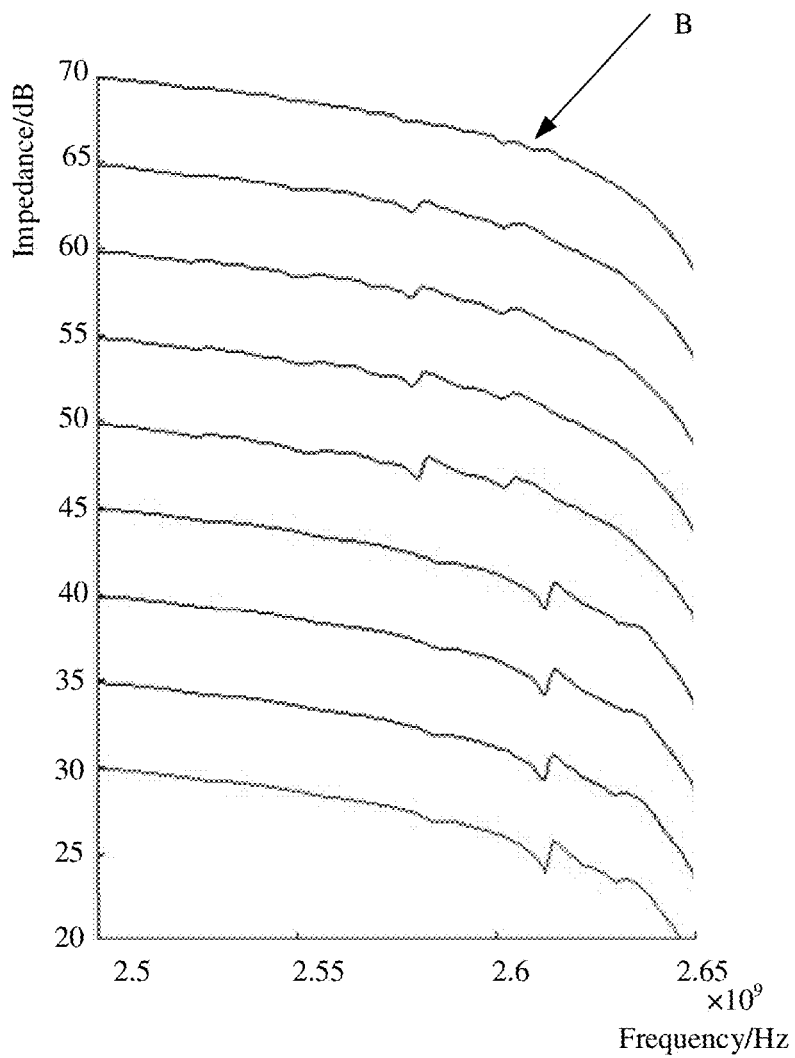
FIG. 3F is a schematic diagram obtained by partially amplifying M1 in FIG. 3E.

Next, the resonator structure shown in FIG. 3C is used as an example to simulate the resonator. The horizontal size W of the step D in the resonator is set to 1 µm, and the vertical size H of the step D is adjusted to increase from 50 nm to 400 nm. For an impedance curve change of the resonator, refer to an illustration in FIG. 3E. A curve G1 is an impedance curve of a resonator in the conventional technology, and other curves from bottom to up are respectively impedance curves that are of the resonator provided in this embodiment of this application and that are illustrated in a process in which the vertical size H increases from 50 nm to 400 nm when the horizontal size W of the step D is equal to 1 µm. Herein, for clear comparison of data, data of adjacent curves is offset by 5 dB in a vertical coordinate direction. As the vertical size H of the step D increases, the border mode harmonic B gradually weakens. A part M1 of each impedance curve having the border mode harmonic B is amplified to obtain FIG. 3F. It can be learned that compared with the resonator in the conventional technology, the resonator provided in this embodiment of this application has obvious suppression effect on the border mode harmonic B. It should be understood that "suppression" herein means reducing the border mode harmonic B, and it is unnecessary to achieve elimination effect, provided that impact of the border mode harmonic B on the passband of the filter can be reduced.

Figure 3G:
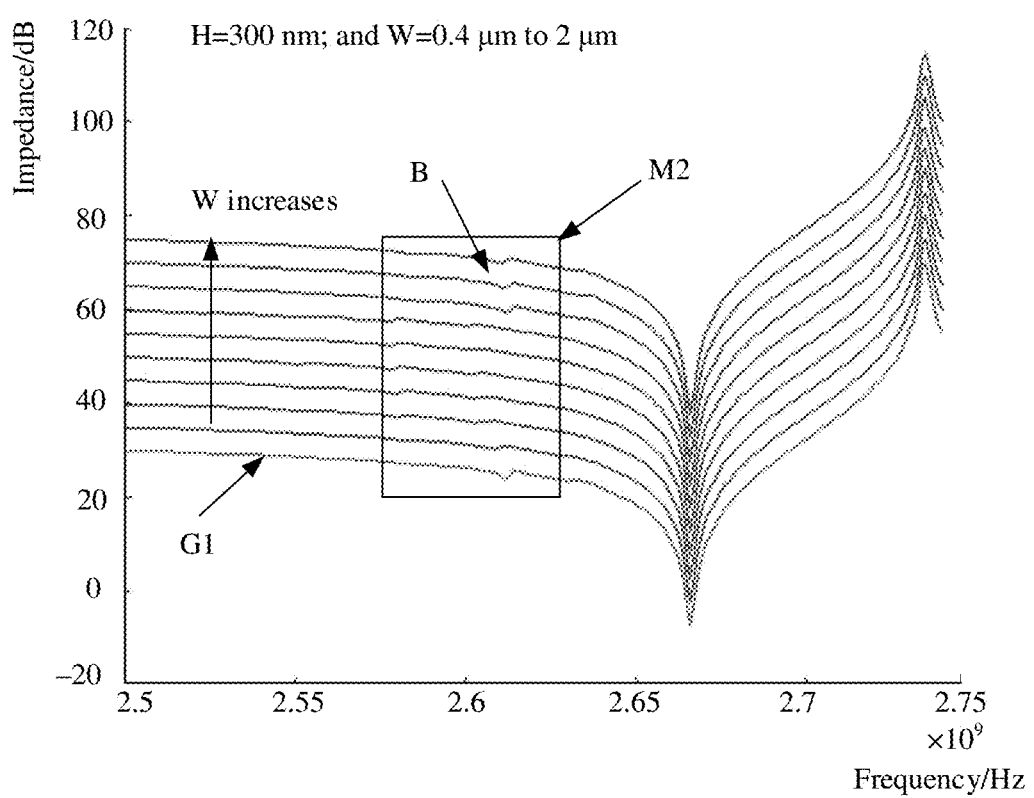
FIG. 3G is a schematic diagram of impedance waveform simulation for a resonator provided in an embodiment of this application and a resonator in the conventional technology.
Figure 3H:
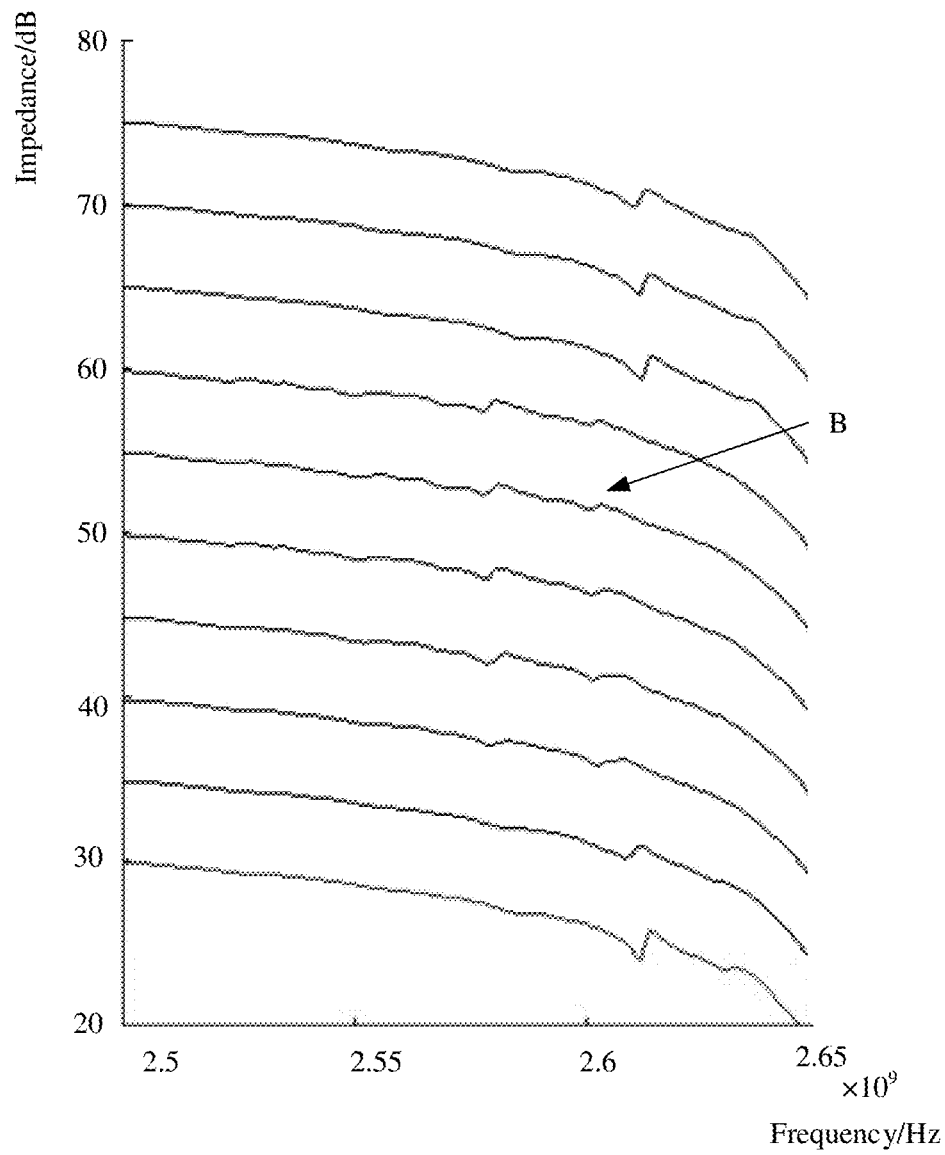
FIG. 3H is a schematic diagram obtained by partially amplifying M2 in FIG. 3G.

Alternatively, the vertical size H of the step D in the resonator is set to 300 nm, and the horizontal size W of the step D is adjusted to increase from 0.4 µm to 2 µm. For an impedance curve change of the resonator, refer to an illustration in FIG. 3G. As shown in FIG. 3G, a curve G1 is an impedance curve of a resonator in the conventional technology, and other curves from bottom to up are respectively impedance curves that are of the resonator provided in this embodiment of this application and that are illustrated in a process in which the horizontal size W of the step D increases from 0.4 µm to 2 µm when the vertical size H is 300 nm. Herein, for clear comparison of data, data of adjacent curves is offset by 5 dB in a vertical coordinate direction. As the horizontal size W of the step D increases, the border mode harmonic B first weakens and then strengthens, and is obviously improved around "W=1 µm". A part M2 of each impedance curve having the border mode harmonic B is amplified to obtain FIG. 3H. It can be learned that compared with the resonator in the conventional technology, the resonator provided in this embodiment of this application has obvious suppression effect on the border mode harmonic B.

Figure 3I:
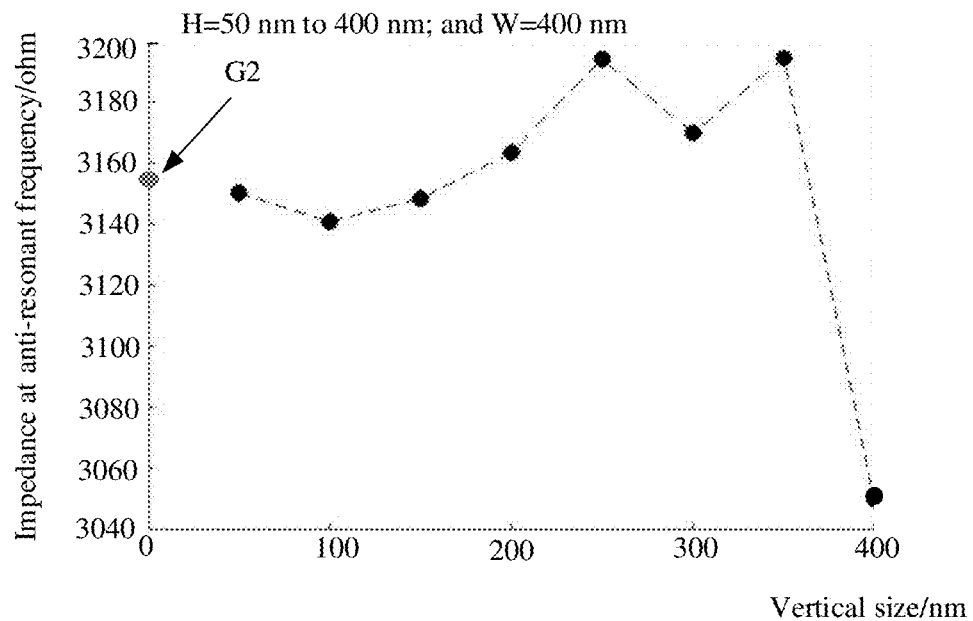
FIG. 3I is a schematic diagram of a comparison between an impedance at anti-resonant frequency of a resonator provided in an embodiment of this application and an impedance at anti-resonant frequency of a resonator in the conventional technology.

In addition, the resonator provided in this embodiment of this application not only can suppress the border mode harmonic B, but also can maintain a high quality factor of the resonator having the border ring. The horizontal size W of the step D in the resonator is set to 400 nm, and the vertical size H of the step D is adjusted to increase from 50 nm to 400 nm. Referring to FIG. 3I that illustrates a change that occurs in an impedance at anti-resonant frequency (Zp) of the resonator provided in this embodiment of this application as the vertical size H of the step D varies, G2 is an impedance at anti-resonant frequency of a resonator in the conventional technology. It can be learned that as the vertical size H of the step D increases from 50 nm to 400 nm, the impedance at anti-resonant frequency slightly increases. When "H=400 nm", the impedance at anti-resonant frequency obviously decreases.

Figure 3J:
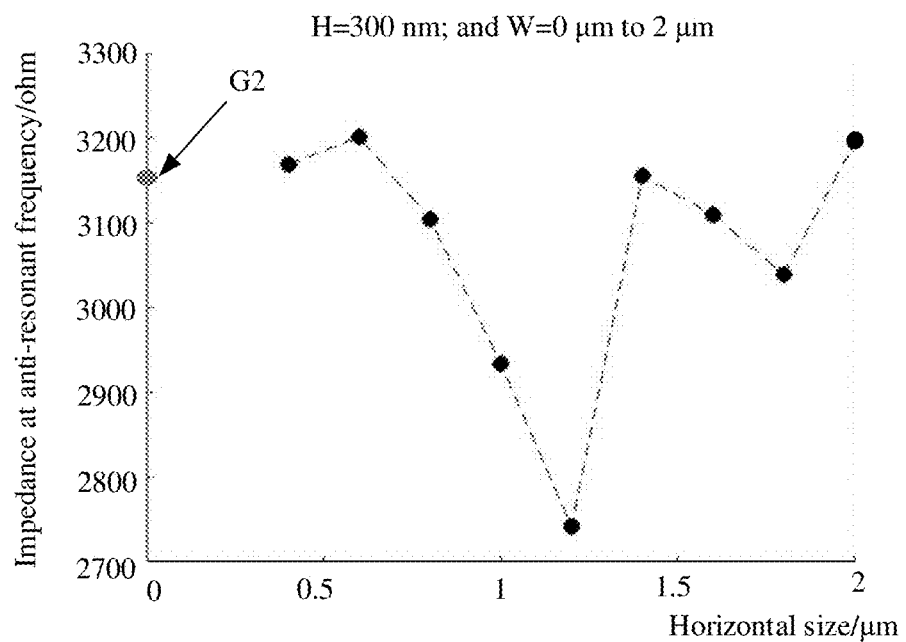
FIG. 3J is schematic diagram of a comparison between an impedance at anti-resonant frequency of a resonator provided in an embodiment of this application and an impedance at anti-resonant frequency of a resonator in the conventional technology.

In still another example, the horizontal size W of the step D in the resonator is set to range from 0 µm to 2 µm, and the vertical size H of the step D is adjusted to 300 nm. Referring to FIG. 3J that illustrates a change that occurs in an impedance at anti-resonant frequency of the resonator provided in this embodiment of this application as the horizontal size W of the step D varies, G2 is an impedance value at anti-resonant frequency of a resonator in the conventional technology. It can be learned that as the horizontal size W of the step D increases from 0 µm to 2 µm, the impedance at anti-resonant frequency fluctuates obviously, and except that the impedance at anti-resonant frequency decreases obviously near "W=1 µm", the impedance at anti-resonant frequency at another location remain basically consistent with that at a location of "W=0".

Figure 3K:
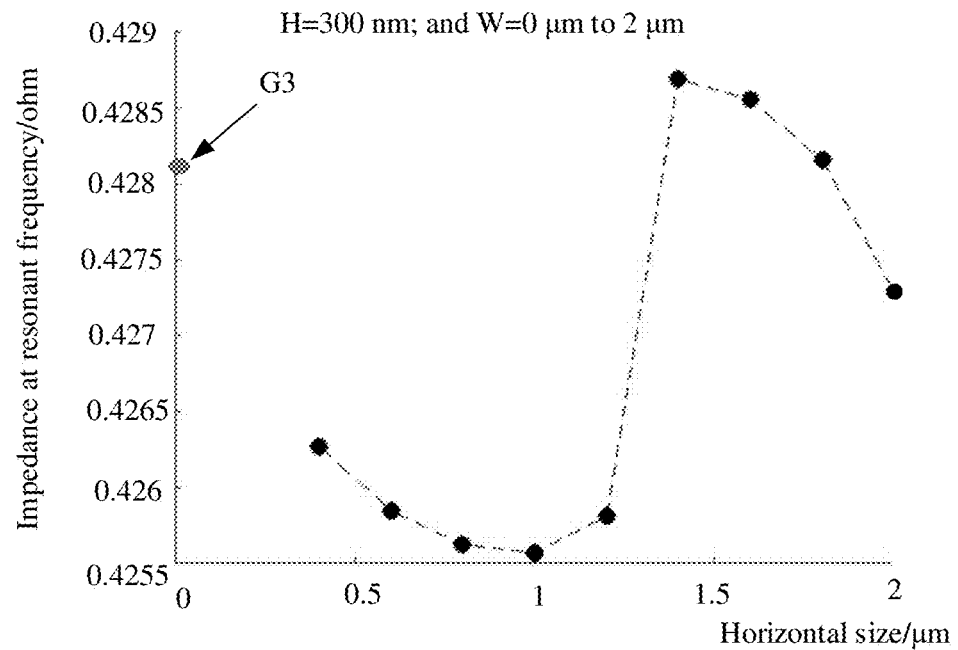
FIG. 3K is a schematic diagram of a comparison between an impedance at resonant frequency of a resonator provided in an embodiment of this application and an impedance at resonant frequency of a resonator in the conventional technology.

In addition, the horizontal size W of the step D in the resonator is set to range from 0 µm to 2 µm, and the vertical size H of the step D is adjusted to 300 nm. Referring to FIG. 3K that illustrates a change that occurs in an impedance at resonant frequency (Zs) of the resonator provided in this embodiment of this application as the horizontal size W of the step D varies, G3 is an impedance value at resonant frequency of a resonator in the conventional technology. It can be learned that as the horizontal size W of the step D increases from 0 µm to 1 µm, the impedance at resonant frequency is obviously lower than the impedance at resonant frequency in the conventional technology.

Figure 3L:
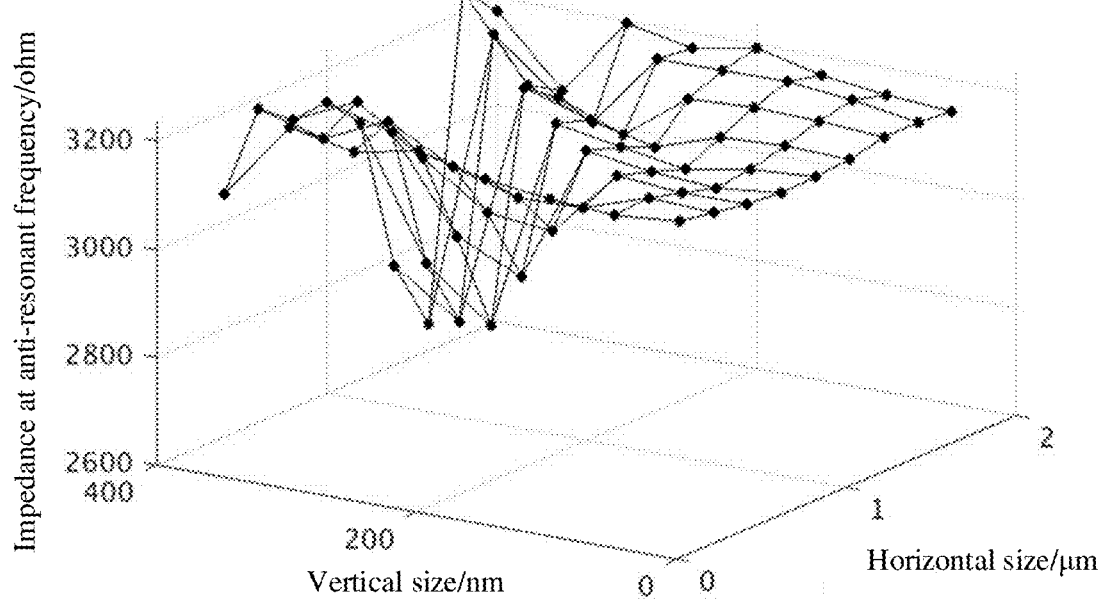
FIG. 3L is a schematic simulation diagram of a change that occurs in an impedance at anti-resonant frequency of a resonator as a step size varies according to an embodiment of this application.
Figure 3M:
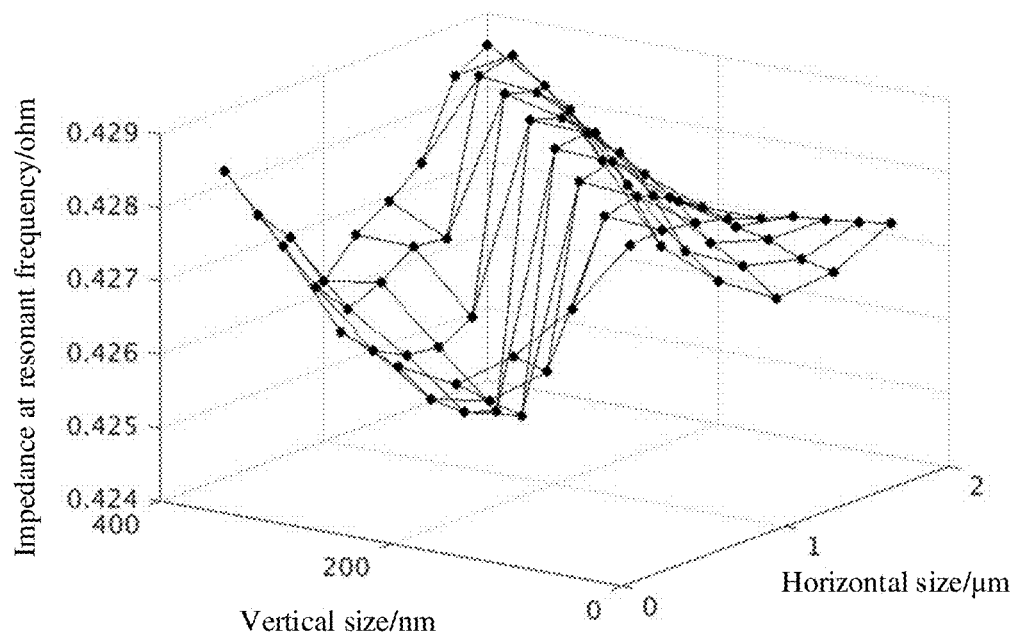
FIG. 3M is a schematic simulation diagram of a change that occurs in an impedance at resonant frequency of a resonator as a step size varies according to an embodiment of this application.

With reference to the examples in FIG. 3I to FIG. 3K, batch simulation is performed on the changes that occur in the impedance at resonant frequency and the impedance at anti-resonant frequency of the resonator as the horizontal size W and the vertical size H of the step D vary, to obtain FIG. 3L that is a schematic diagram of a change that occurs in an impedance at anti-resonant frequency as the horizontal size W and the vertical size H of the step D vary, and FIG. 3M that is a schematic diagram of a change that occurs in an impedance at resonant frequency as the horizontal size W and the vertical size H of the step D vary. Using FIG. 3L as an example, different horizontal sizes W cooperate with different vertical sizes H to correspond to different impedance values at anti-resonant frequency, and a mesh surface formed by all impedance values at anti-resonant frequency presents a periodically fluctuated surface. To be specific, as the horizontal size W and the vertical size H of the step D vary, the impedance value at anti-resonant frequency fluctuates periodically. Except that some impedance values at anti-resonant frequency are relatively small, impedances at anti-resonant frequency at other locations are all relatively large, that is, the resonator can maintain a relatively high quality factor at anti-resonant frequency (Qp).

Referring to FIG. 3M, different horizontal sizes W cooperate with different vertical sizes H to correspond to different impedance values at resonant frequency, and a mesh surface formed by all impedance values at resonant frequency presents a periodically fluctuated surface. As the horizontal size W and the vertical size H of the step D vary, the impedance value at resonant frequency fluctuates periodically. However, relatively, the impedance at resonant frequency fluctuates extremely slightly, and it may be considered that there is no impact on a quality factor at resonant frequency (Qs) of the resonator.

Through combination of illustrations in FIG. 3L and FIG. 3M, it can be learned that in actual use, a corresponding horizontal size W and a corresponding vertical size H of the step D may be selected for the resonator provided in this embodiment of this application, to obtain an optimal impedance value at anti-resonant frequency.

Figure 4A:
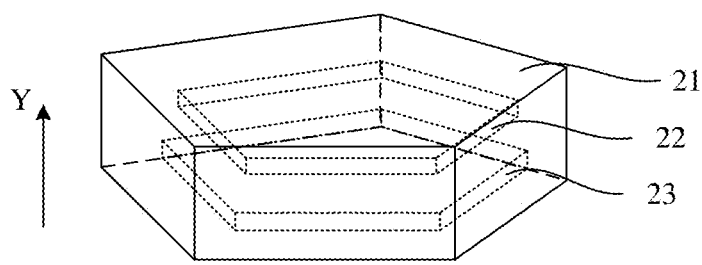
FIG. 4A is a schematic diagram of a structure of a Bragg reflection layer in a resonator according to an embodiment of this application.

In a possible implementation, as shown in FIG. 4A, the Bragg reflection layer 2 may further include a second high acoustic-impedance structure 23. The first high acoustic-impedance structure 22 and the second high acoustic-impedance structure 23 are distributed up and down in parallel in FIG. 4A, and the low acoustic-impedance structure 21 is disposed between the first high acoustic-impedance structure 22 and the second high acoustic-impedance structure 23. Due to the laminated structure of the first high acoustic-impedance structure 22 and the second high acoustic-impedance structure 23, the first high acoustic-impedance structure 22 and the second high acoustic-impedance structure 23 are parallel to each other along the stacking direction (that is, the Y direction). In addition, along a reverse direction of the Y direction, sizes that are of the first high acoustic-impedance structure 22 and the second high acoustic-impedance structure 23 and that are perpendicular to the stacking direction gradually increase (equivalent to radial sizes) from top to down. In the entire resonator, the first high acoustic-impedance structure 22 with a smaller size is closer to the piezoelectric layer 1, and the second high acoustic-impedance structure 23 with a larger size is closer to the substrate 3. Such a structure design is to consider that when a sound is propagated from one side of the piezoelectric layer 1 to one side of the substrate 3, a waveform range of the sound increases, and such as a structure design of the high acoustic-impedance structure can match a waveform of the sound, thereby meeting a resonance requirement.

It can be understood that the Bragg reflection layer 2 may further include a third high acoustic-impedance structure, a fourth high acoustic-impedance structure, and more high acoustic-impedance structures. All the high acoustic-impedance structures are embedded in the low acoustic-impedance structure and are parallel to each other along the stacking direction. Radial sizes of the high acoustic-impedance structures gradually increase in a direction pointing from the piezoelectric layer 1 to the substrate 3. Certainly, the low acoustic-impedance structure 21 is disposed between any two high acoustic-impedance structures, so that the high acoustic-impedance structures and the low acoustic-impedance structures alternate with each other to form a laminated structure, thereby facilitating sound propagation and reflection in the layers of structures.

Figure 4B:
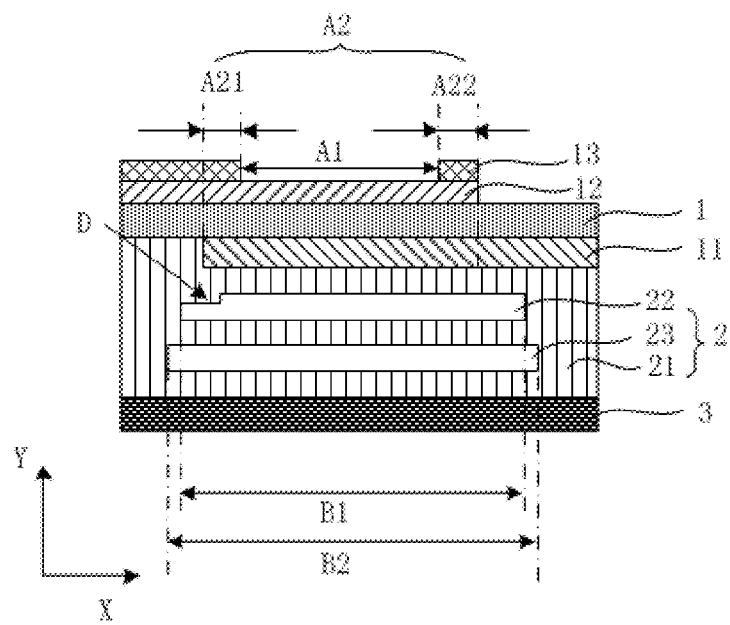
FIG. 4B to FIG. 4E are schematic diagrams of cross-section structures of a resonator according to an embodiment of this application.

Based on the structure of the resonator shown in FIG. 4A, the resonator provided in this embodiment of this application is sectioned by using a plane perpendicular to the edge having the step D, to obtain an illustration of a cross-section structure of the resonator shown in FIG. 4B (it should be understood that FIG. 4B shows merely an example of a correspondence between structures of the resonator in a cross-section state, and does not completely correspond to structure details in FIG. 2).

In FIG. 4B, along a direction pointing from the piezoelectric layer 1 to the substrate 3, a radial size (a size along the X direction) of the first high acoustic-impedance structure 22 is less than a radial size (a size along the X direction) of the second high acoustic-impedance structure 23. For the size of the first high acoustic-impedance structure 22, refer to B1, and for the size of the second high acoustic-impedance structure 23, refer to B2. Using the substrate 3 as a reference, a projection area of B1 on the substrate 3 is smaller than a projection area of B2 on the substrate 3.

Figure 4C:
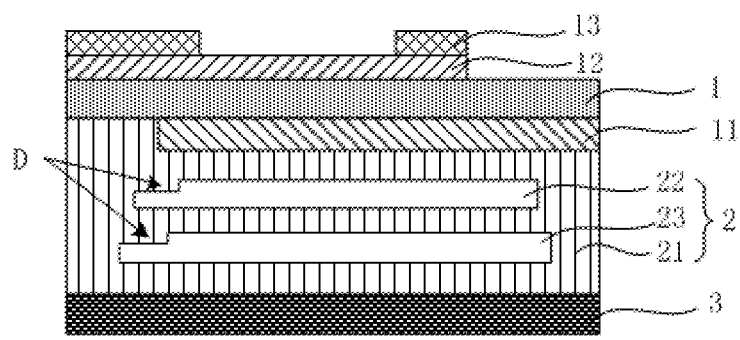

Based on the structure of the resonator shown in FIG. 4B, FIG. 4C shows a cross-section structure of another resonator. As shown in FIG. 4C, a step D is separately disposed on an edge that is of the first high acoustic-impedance structure 22 and that corresponds to a side has the step D in the second high acoustic-impedance structure 23. Certainly, similar to the example in FIG. 4B, each step D needs to meet the following conditions: A horizontal size W of the step D is greater than 200 nm and less than a distance between the edge and the edge of the first resonance region A1, and a vertical size H of the step D is greater than 20 nm and less than the thickness of the first high acoustic-impedance structure 22.

Figure 4D:
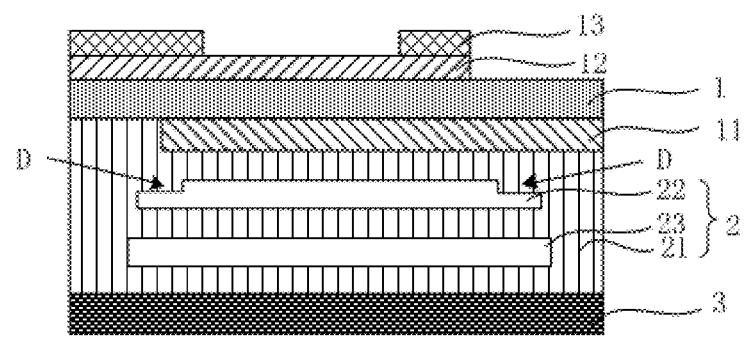

Based on the structure of the resonator shown in FIG. 4B, FIG. 4D shows a cross-section structure of still another resonator. As shown in FIG. 4D, a step D is disposed on each of two edges of the first high acoustic-impedance structure 22 (due to a perspective limitation, the two edges are equivalent to two ends of the first high acoustic-impedance structure 22 that are shown in FIG. 4D). Certainly, similar to the example in FIG. 4B, each step D needs to meet the following conditions: A horizontal size W of the step D is greater than 200 nm and less than a distance between the edge and the edge of the first resonance region A1, and a vertical size H of the step D is greater than 20 nm and less than the thickness of the first high acoustic-impedance structure 22.

It can be understood that the two steps D shown in FIG. 4D are respectively disposed on the two edges of the first high acoustic-impedance structure 22, and the step D may alternatively be disposed on three edges or four edges of the first high acoustic-impedance structure 22. When a shape of the Bragg reflection layer 2 changes, a shape of the first high acoustic-impedance structure 22 changes accordingly. Therefore, a quantity of steps D is related to a quantity of edges of the first high acoustic-impedance structure 22. For example, if the Bragg reflection layer 2 is heptagon-shaped, the first high acoustic-impedance structure 22 is also heptagon-shaped. Accordingly, a quantity of edges on which the step D can be disposed may change to seven.

Under a condition that the thickness of the first high acoustic-impedance structure 22 is ignored, when a quantity of edges provided with the step D is 2, for example, the following may be set in the structure of the resonator shown in FIG. 4D: In a plane perpendicular to the edges, the steps D have different horizontal sizes, and the steps D have a same vertical size. The vertical size corresponds to propagation of an acoustic wave in the Y direction, and the horizontal size corresponds to propagation of an acoustic wave in the X direction. Such a structure design is conducive to meeting a resonance requirement. Certainly, the quantity of edges provided with the step D may further increase, for example, may be 3, 4, 5, or even more, and specification sizes of the steps D should also meet the foregoing conditions.

Figure 4E:
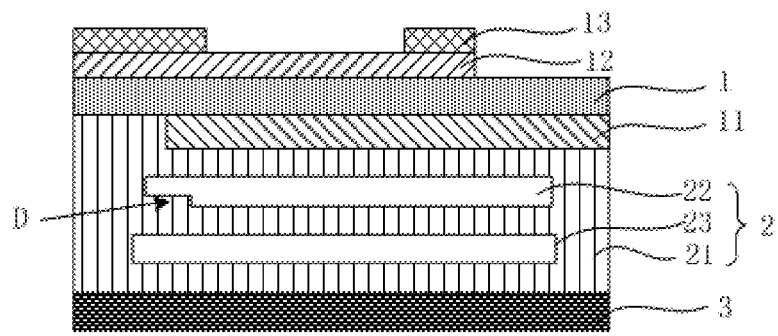

Based on the structure of the resonator shown in FIG. 4B, FIG. 4E shows a structure variation of a resonator. As shown in FIG. 4E, the step D herein is also disposed on an edge of the first high acoustic-impedance structure 22. Different from the structure in FIG. 4B, the bottom surface of the step D herein faces the substrate 3.

Figure 5:
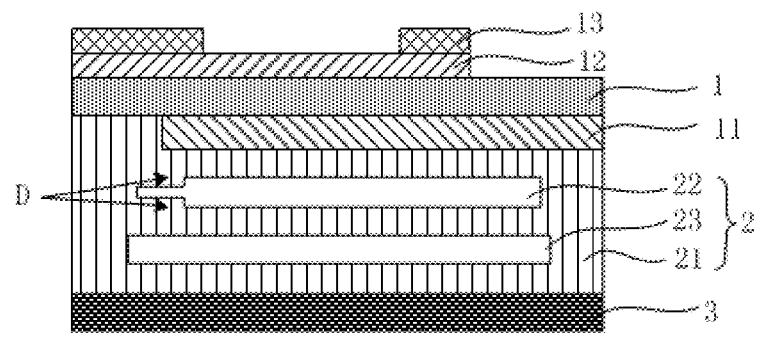
FIG. 5 is a schematic diagram of a cross-section structure of a resonator according to an embodiment of this application.

With reference to the resonator illustrated in FIG. 4B and the resonator illustrated in FIG. 4E, FIG. 5 shows a structure of a resonator, and the following is set: The thickness of the first high acoustic-impedance structure 22 cannot be ignored, and along a thickness direction of the first high acoustic-impedance structure 22, two steps D are respectively disposed on two edges on a same side of the first high acoustic-impedance structure 22, where a bottom surface of one step D faces the piezoelectric layer 1, and a bottom surface of the other step D faces the substrate 3. It should be understood that a vertical size H of each step D herein is greater than 20 nm and less than ½ of the thickness of the first high acoustic-impedance structure 22.

Figure 6A:
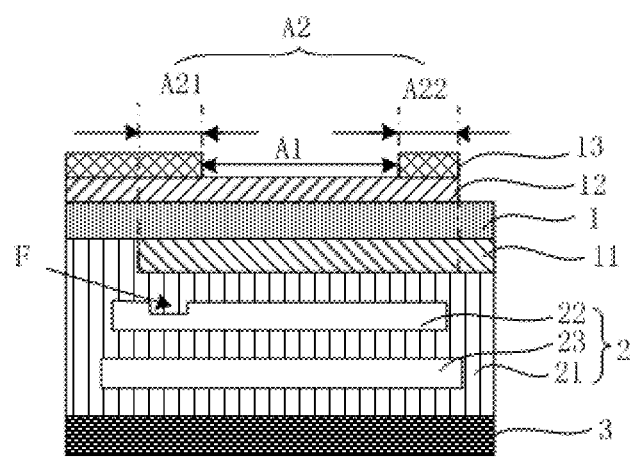
FIG. 6A is a schematic diagram of a cross-section structure of a resonator according to an embodiment of this application.

In addition, FIG. 6A further shows a structure of a resonator that may be implemented. Different from the structures of the resonators shown in FIG. 3C, FIG. 4B to FIG. 4E, and FIG. 5, a groove F is disposed on a surface that is of the first high acoustic-impedance structure 22 and that faces the piezoelectric layer 1, where an opening of the groove F faces the piezoelectric layer 1. In FIG. 6A, a projection of the groove F in the piezoelectric layer 1 falls within a projection range of the border ring 13 in the piezoelectric layer 1. For a structure of the groove F relative to the first high acoustic-impedance structure 22, refer to an illustration in FIG. 6B.

Figure 6B:
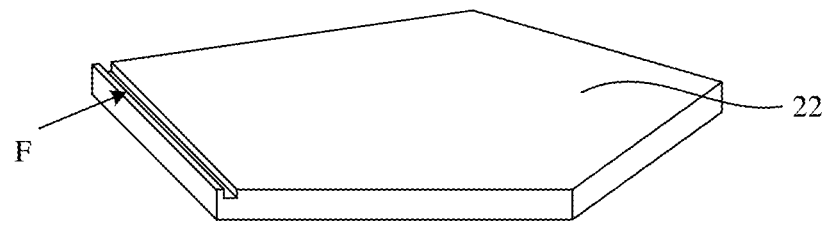
FIG. 6B is a schematic diagram of a structure of a first high acoustic-impedance structure in FIG. 6A.
Figure 6C:
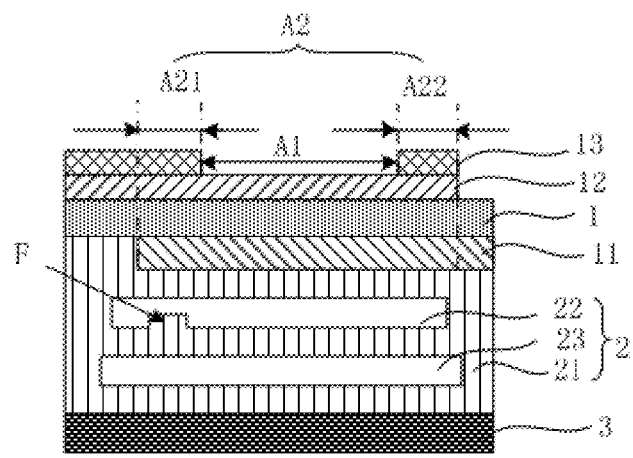
FIG. 6C and FIG. 6D are schematic diagrams of cross-section structures of a resonator according to an embodiment of this application.
Figure 6D:
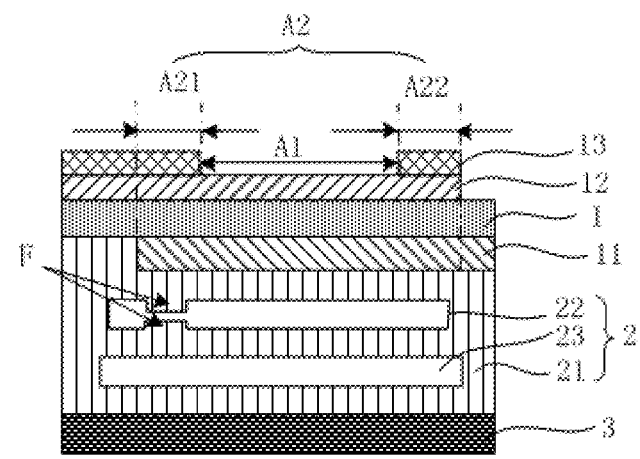

Certainly, the opening of the groove F may alternatively face the substrate 3 (as shown in FIG. 6C), or the groove F may be simultaneously disposed on two surfaces of the first high acoustic-impedance structure 22 (as shown in FIG. 6D). In addition, a quantity of grooves F and a shape of the groove F are not limited herein.

It should be understood that FIG. 4B to FIG. 4E, FIG. 5, and FIG. 6A to FIG. 6C show merely several structures that may be implemented for the resonator. Both a discontinuous structure in a form of the step D and a discontinuous structure in a form of the groove F are merely structures configured to suppress a border mode harmonic in this application. Two or more implementations may be implemented in combination in a specific implementation process, to meet a requirement for suppressing a border mode harmonic. In addition, both the step D and the groove F are manners of disposing a discontinuous structure on a surface of a high acoustic-impedance structure (for example, the first high acoustic-impedance structure 22). In this application, it is unnecessary that the discontinuous structure can be disposed on only the surface of the high acoustic-impedance structure, for example, the discontinuous structure may be disposed inside the high acoustic-impedance structure. Details are not described herein.

Figure 7:
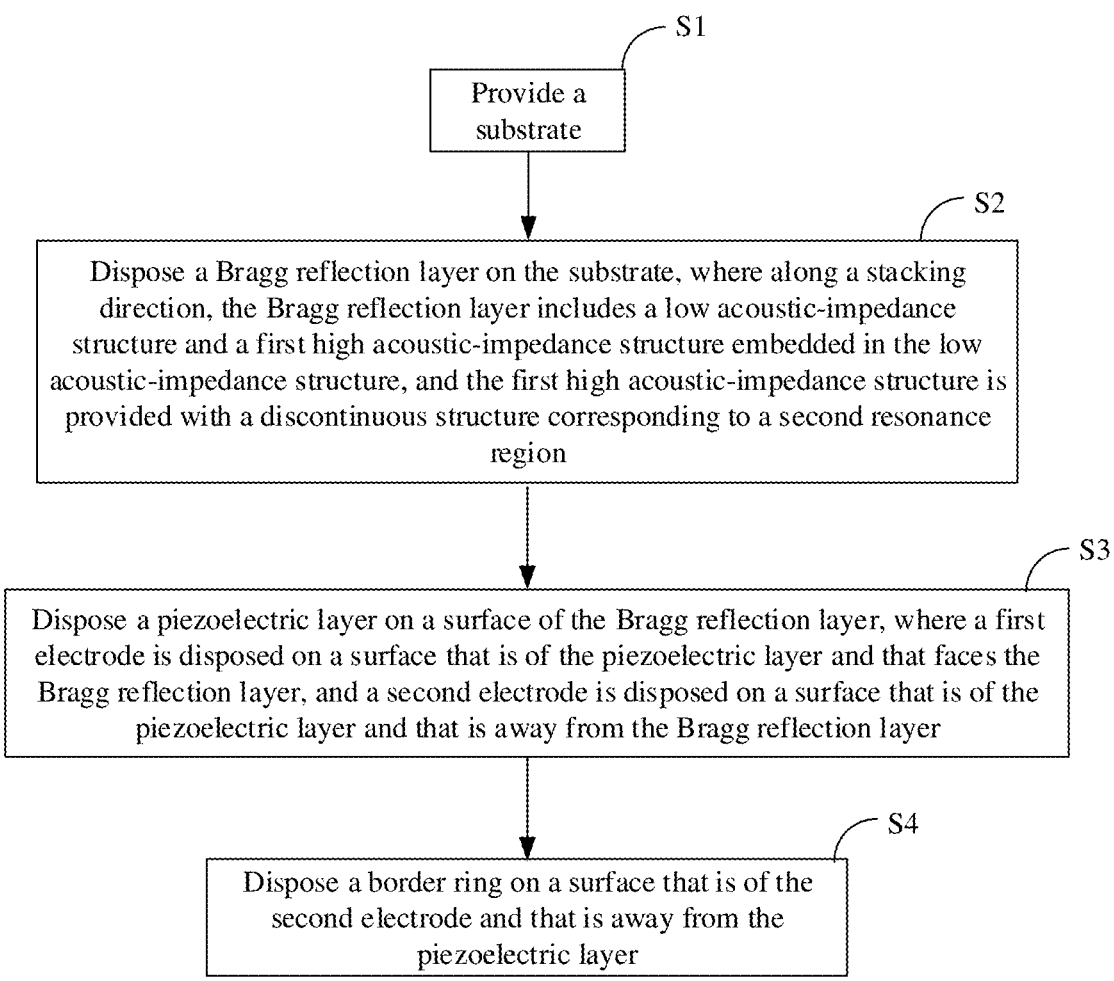
FIG. 7 is a schematic flowchart of a method for manufacturing a resonator according to an embodiment of this application.

Using the structure of the resonator provided in the foregoing embodiment as an example, an embodiment of this application may further provide a method for manufacturing a resonator. Using the structure of the resonator shown in FIG. 3C as an example, the resonator herein has the first resonance region A1 and the second resonance region A2. With reference to FIG. 7, the method for manufacturing the resonator includes the following steps.

S1: Provide a substrate 3, where a material of the substrate 3 herein may be silicon.

S2: Dispose a Bragg reflection layer 2 on the substrate 3, where along a stacking direction, the Bragg reflection layer 2 includes a low acoustic-impedance structure 21 and a first high acoustic-impedance structure 22 embedded in the low acoustic-impedance structure 21, the first high acoustic-impedance structure 22 has a discontinuous structure corresponding to the second resonance region A2, and the discontinuous structure herein is configured to suppress a border mode harmonic.

S3: Dispose a piezoelectric layer 1 on a surface of the Bragg reflection layer 2, where a first electrode 11 is disposed on a surface that is of the piezoelectric layer 1 and that faces the Bragg reflection layer 2, and a second electrode 12 is disposed on a surface that is of the piezoelectric layer 1 and that is away from the Bragg reflection layer 2.

S4: Dispose a border ring 13 on a surface that is of the second electrode 12 and that is away from the piezoelectric layer 1.

Referring to FIG. 3C, the stacking direction is the Y direction. In FIG. 3C, a step D is disposed on an edge of the first high acoustic-impedance structure 22, and in FIG. 6A, a groove F is disposed on the surface of the first high acoustic-impedance structure 22. In both manners, a surface that is of the first high acoustic-impedance structure 22 and that faces the piezoelectric layer 1 can have a discontinuous structure.

For different structure implementation forms of the first high acoustic-impedance structure 22, there may also be different implementation steps in step S2 herein of disposing the Bragg reflection layer 2 on the substrate 3. For details, refer to the following examples.

Figure 8:
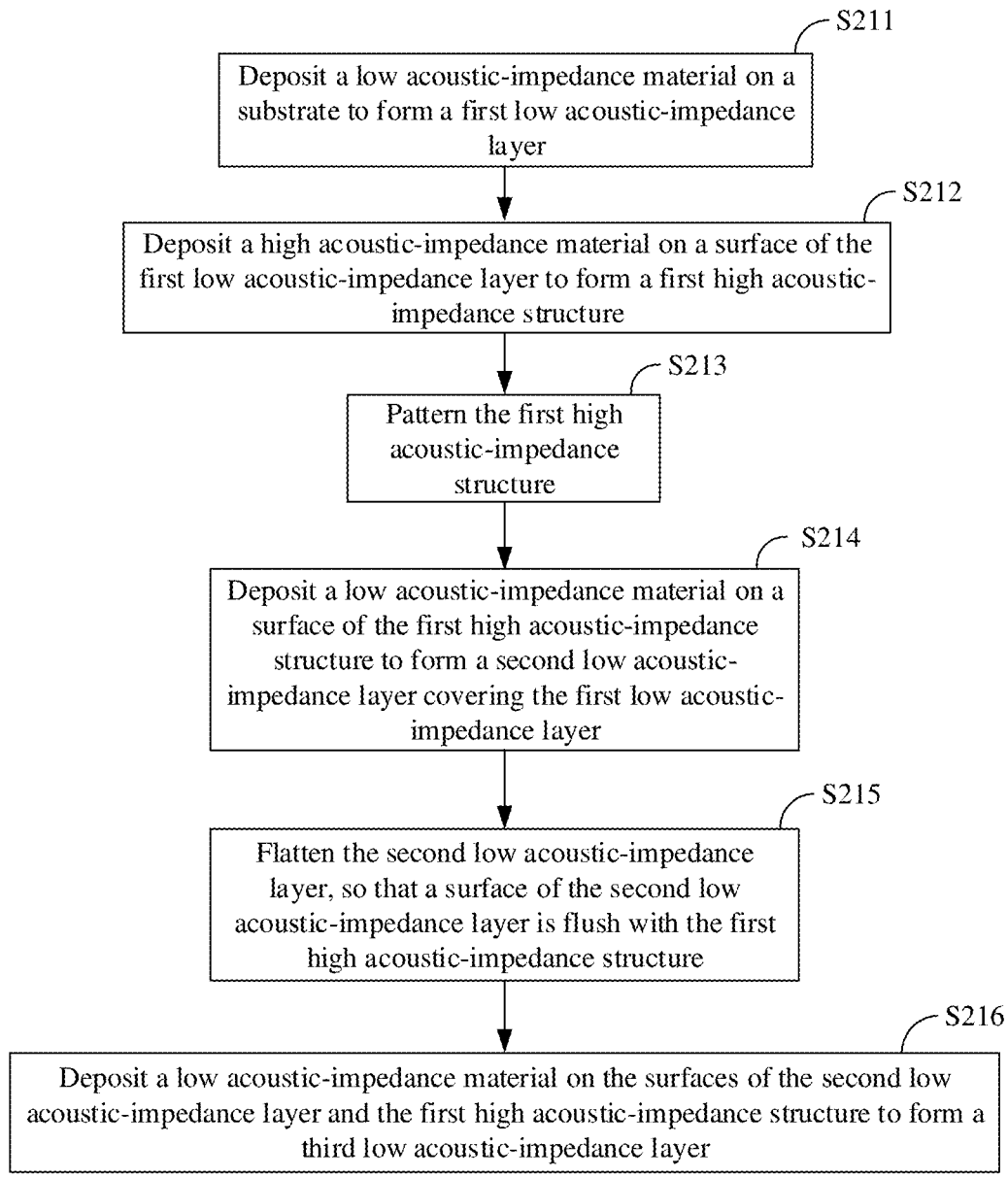
FIG. 8 is a schematic flowchart of disposing a Bragg reflection layer in a method for manufacturing a resonator according to an embodiment of this application.

Manner 1: As shown in FIG. 8, step S2 may specifically include the following steps.

Figure 9A:
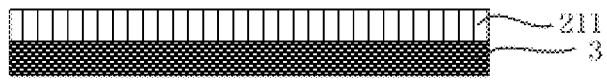
FIG. 9A to FIG. 9F are schematic diagrams of structure changes in a process of manufacturing a Bragg reflection layer in a resonator provided in an embodiment of this application.

S211: Deposit a low acoustic-impedance material on the substrate 3 to form a first low acoustic-impedance layer 211, to obtain a structure shown in FIG. 9A.

Figure 9B:
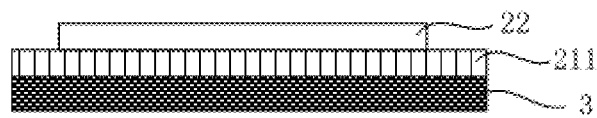

S212: Deposit a high acoustic-impedance material on a surface of the first low acoustic-impedance layer 211 to form the first high acoustic-impedance structure 22, to obtain a structure shown in FIG. 9B.

Figure 9C:
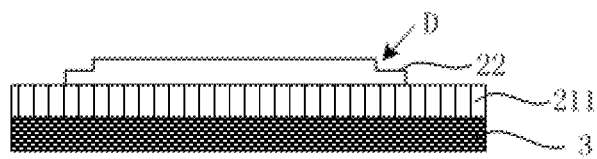

S213: Pattern the first high acoustic-impedance structure 22, so that the first high acoustic-impedance structure 22 has a discontinuous structure (the step D), to obtain a structure shown in FIG. 9C.

Figure 9D:
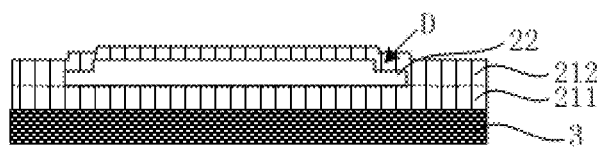

S214: Deposit a low acoustic-impedance material on a surface of the first high acoustic-impedance structure 22 to form a second low acoustic-impedance layer 212 covering the first low acoustic-impedance layer 211, to obtain a structure shown in FIG. 9D.

Figure 9E:
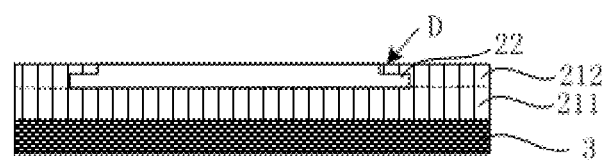

S215: Flatten the second low acoustic-impedance layer 212, so that a surface of the second low acoustic-impedance layer 212 is flush with a surface of the first high acoustic-impedance structure 22, to obtain a structure shown in FIG. 9E.

Figure 9F:
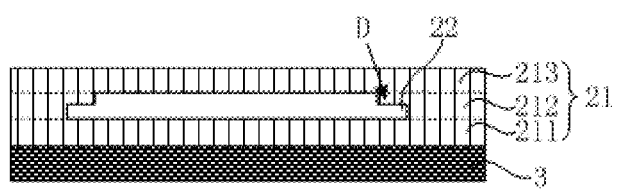

S216: Deposit a low acoustic-impedance material on the surfaces of the second low acoustic-impedance layer 212 and the first high acoustic-impedance structure 22 to form a third low acoustic-impedance layer 213. As shown in FIG. 9F, the first low acoustic-impedance layer 211, the second low acoustic-impedance layer 212, and the third low acoustic-impedance layer 213 have an integrated structure, and the three low acoustic-impedance layers jointly form the low acoustic-impedance structure 21.

It can be learned that a bottom surface of the step D in the first high acoustic-impedance structure 22 shown in this manner faces the piezoelectric layer 1, and this may correspond to the structures of the steps D shown in FIG. 3C, FIG. 4B, FIG. 4C, and FIG. 4D, the structure of the groove F shown in FIG. 6A, the structure of the step D facing the piezoelectric layer 1 in FIG. 5, and the structure of the groove F facing the piezoelectric layer 1 in FIG. 6D.

Figure 10:
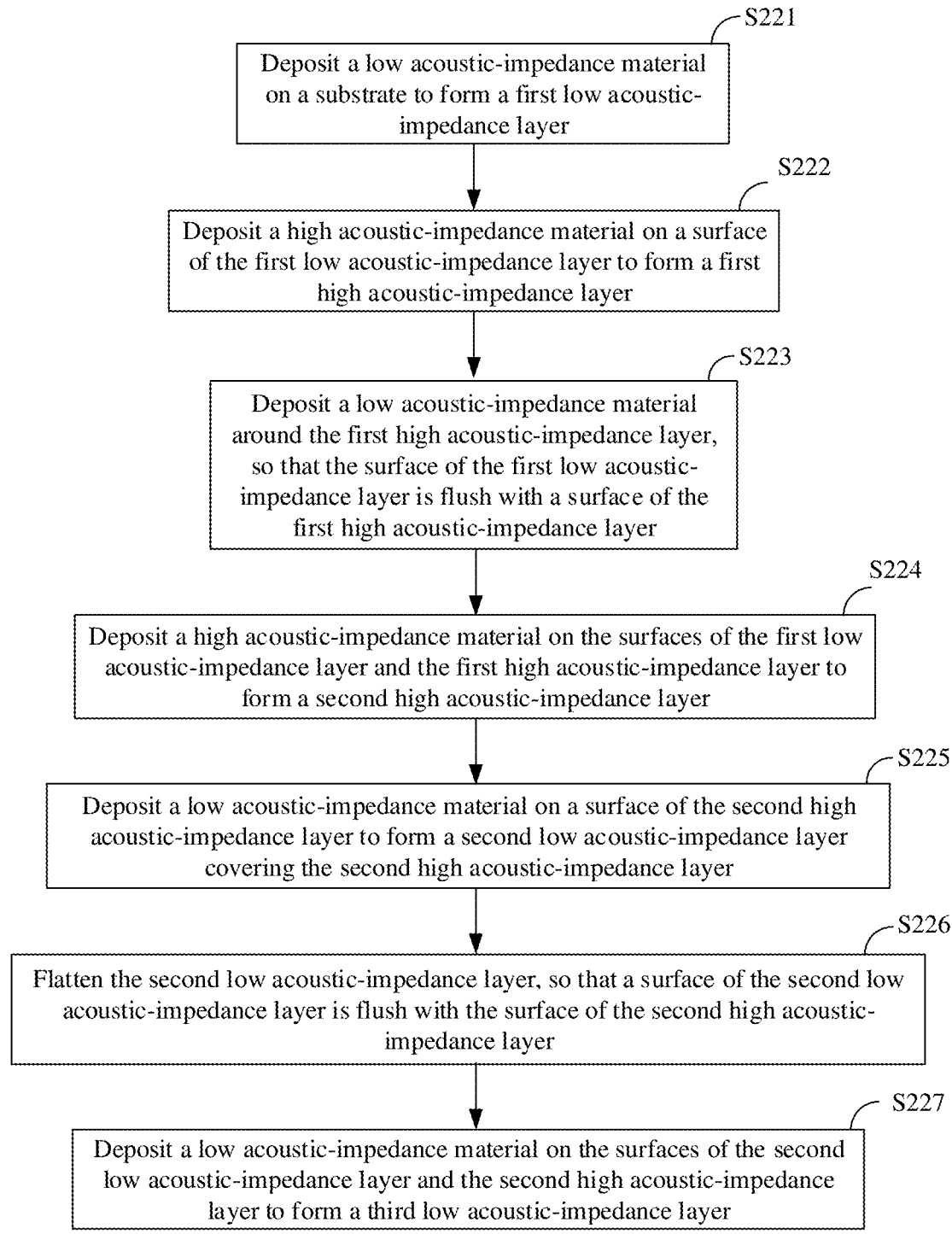
FIG. 10 is a schematic flowchart of disposing a Bragg reflection layer in a method for manufacturing a resonator according to an embodiment of this application.

Manner 2: As shown in FIG. 10, step S2 may specifically include the following steps.

S221: Deposit a low acoustic-impedance material on the substrate 3 to form a first low acoustic-impedance layer 211, where for a structure of the first low acoustic-impedance layer 211, reference may be made to an illustration in FIG. 9A, which is not illustrated herein.

Figure 11A:
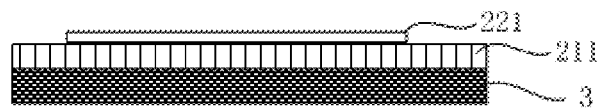
FIG. 11A to FIG. 11F are schematic diagrams of structure changes in a process of manufacturing a Bragg reflection layer in a resonator provided in an embodiment of this application.

S222: Deposit a high acoustic-impedance material on a surface of a first low acoustic-impedance layer 211 to form a first high acoustic-impedance layer 221, so that a structure shown in FIG. 11A may be obtained on the structure shown in FIG. 9A.

Figure 11B:
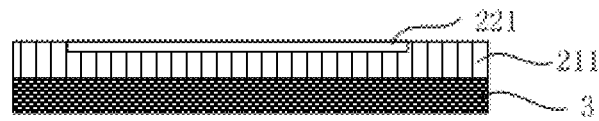

S223: Deposit a low acoustic-impedance material around the first high acoustic-impedance layer 221, so that the surface of the first low acoustic-impedance layer 211 is flush with a surface of the first high acoustic-impedance layer 221, to obtain a structure shown in FIG. 11B.

Figure 11C:
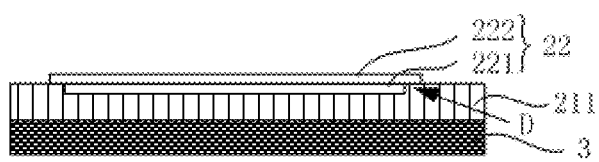

S224: Deposit a high acoustic-impedance material on the surfaces of the first low acoustic-impedance layer 211 and the first high acoustic-impedance layer 221 to form a second high acoustic-impedance layer 222, where herein, as shown in FIG. 11C, the second high acoustic-impedance layer 222 and the first high acoustic-impedance layer 221 have an integrated structure, and a radial size of the second high acoustic-impedance layer 222 is greater than a radial size of the first high acoustic-impedance layer 221, to form the first high acoustic-impedance structure 22 having a discontinuous structure (the step D).

Figure 11D:
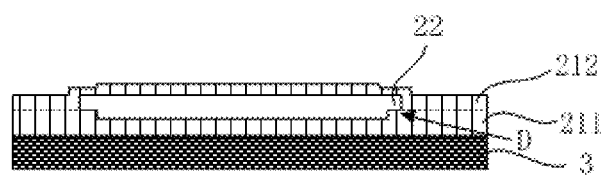

S225: Deposit a low acoustic-impedance material on a surface of the second high acoustic-impedance layer 222 to form a second low acoustic-impedance layer 212 covering the second high acoustic-impedance layer 222, to obtain a structure shown in FIG. 11D, where herein, the second low acoustic-impedance layer 212 and the first low acoustic-impedance layer 211 have an integrated structure.

Figure 11E:
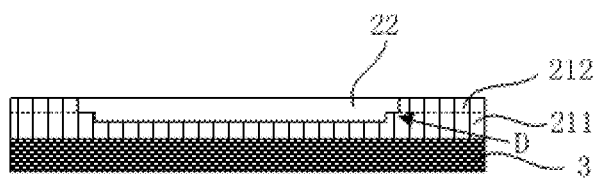

S226: Flatten the second low acoustic-impedance layer 212, so that a surface of the second low acoustic-impedance layer 212 is flush with the surface of the second high acoustic-impedance layer 222, to obtain a structure shown in FIG. 11E.

Figure 11F:
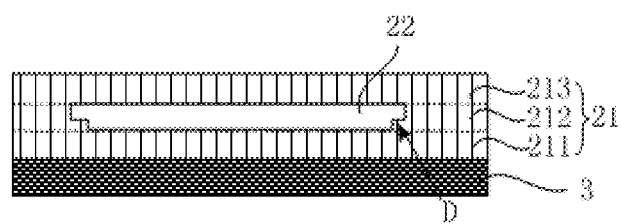

S227: Deposit a low acoustic-impedance material on the surfaces of the second low acoustic-impedance layer 212 and the second high acoustic-impedance layer 222 to form a third low acoustic-impedance layer 213. As shown in FIG. 11F, the first low acoustic-impedance layer 211, the second low acoustic-impedance layer 212, and the third low acoustic-impedance layer 213 have an integrated structure, and the three low acoustic-impedance layers jointly form the low acoustic-impedance structure 21.

It can be learned that a bottom surface of the step D in the first high acoustic-impedance structure 22 shown in this manner faces the substrate 3, and this may correspond to the structure of the step D shown in FIG. 4E, the structure of the groove F shown in FIG. 6B, the structure of the step D facing the substrate 3 in FIG. 5, and the structure of the groove F facing the substrate 3 in FIG. 6D. It should be understood that the manufacturing methods shown in FIG. 8 and FIG. 10 are both specific to a structure in which only the first high acoustic-impedance structure 22 exists in the Bragg reflection layer 2. When a second high acoustic-impedance structure 23 is further embedded in the Bragg reflection layer 2 (as shown in FIG. 4A), a corresponding step of manufacturing the second high acoustic-impedance structure 23 may be added to the manufacturing method based on a structure of the second high acoustic-impedance structure 23. Details are not described herein.

A frequency filter component can be constructed by connecting the foregoing resonators based on a specific topology structure. Therefore, an embodiment of this application further provides a specific filter. Referring to a filter 100 having a Ladder structure (that is, a trapezoidal structure) shown in FIG. 12, the filter 100 includes an input terminal 10, an output terminal 20, a series branch S, a first parallel branch P1, and a first filter unit 31. One end of the series branch S is connected to the input terminal 10, and the other end is connected to the output terminal 20. One end of the first parallel branch P1 is connected to the series branch S, and the other end is grounded. The first filter unit 31 includes a first series resonator 311 disposed on the series branch S and a first parallel resonator 312 disposed on the first parallel branch P1. Herein, the first series resonator 311 is provided with a structure that can suppress a border mode harmonic.

In a possible implementation, for a structure of the first series resonator 311, refer to the structures of the resonators provided in the foregoing embodiment (for example, as shown in FIG. 3C, FIG. 4B to FIG. 4E, FIG. 5, FIG. 6A, FIG. 6C, and FIG. 6D). Based on the description of the foregoing embodiment, a resonator of this structure can effectively suppress a border mode harmonic. The first parallel resonator 312 may also be provided with a structure configured to suppress a border mode harmonic. For example, the first parallel resonator 312 may also be the resonator provided in the foregoing embodiment. Certainly, the first parallel resonator 312 may alternatively be a common resonator.

Figure 12:
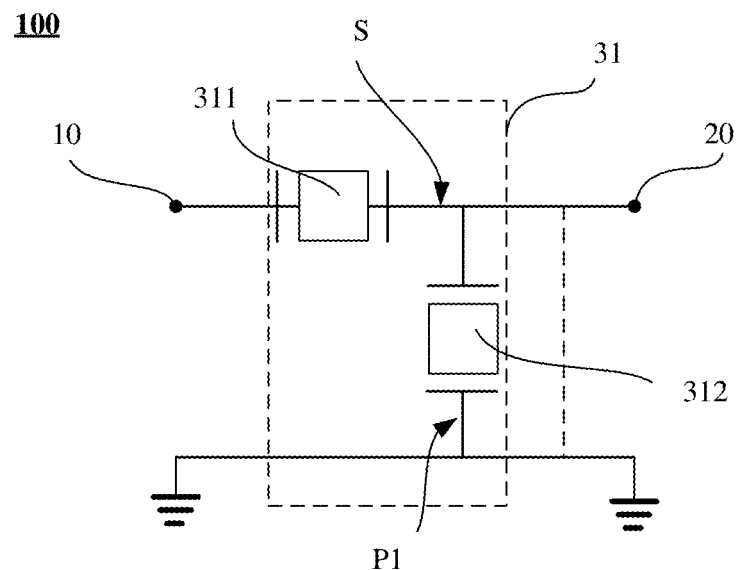
FIG. 12, FIG. 13, and FIG. 14 are schematic diagrams of structures of a filter according to an embodiment of this application.
Figure 13:
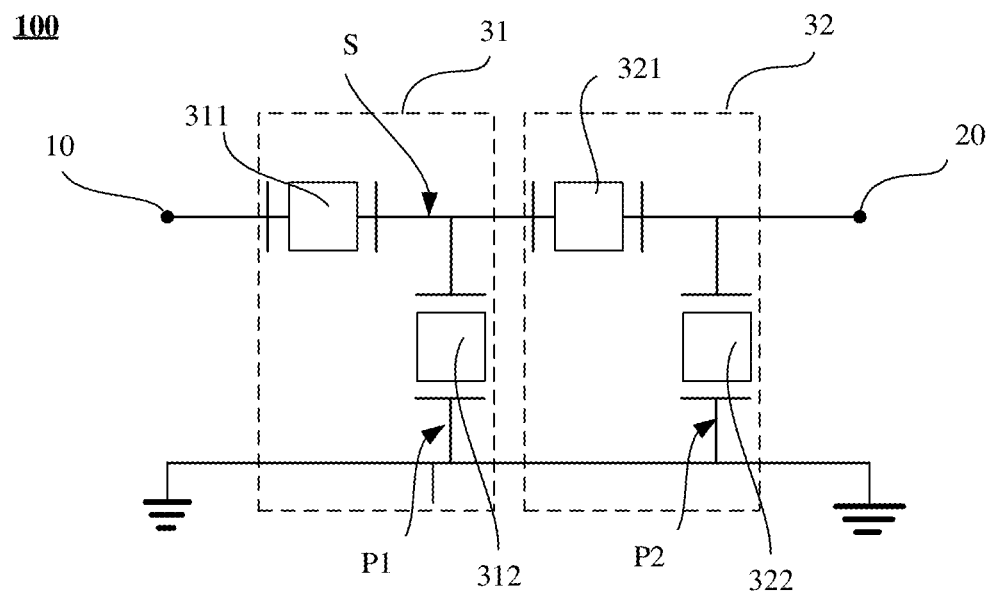

A filter 100 shown in FIG. 13 may be obtained by further extending the filter structure shown in FIG. 12. A difference between the filter 100 and the filter 100 shown in FIG. 12 lies in that the filter 100 further includes a second parallel branch P2 and a second filter unit 32. One end of the second parallel branch P2 is connected to the series branch S, and the other end is grounded. The second parallel branch P2 is equivalent to being disposed in parallel to the first parallel branch P1. A structure of the second filter unit 32 is similar to a structure of the first filter unit 31. The second filter unit 32 includes a second series resonator 321 disposed on the series branch S and a second parallel resonator 322 disposed on the second parallel branch P2. Herein, a structure of the second series resonator 321 may be similar to a structure of the first series resonator 321.

Figure 14:
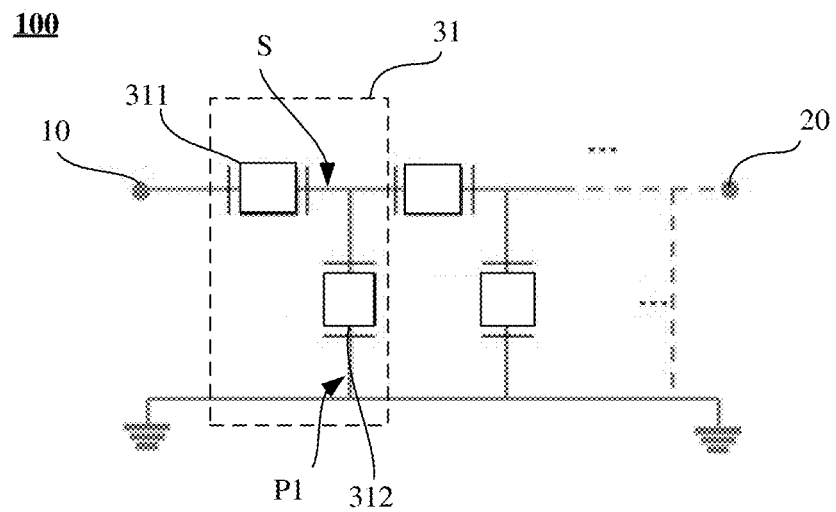
Figure 15A:
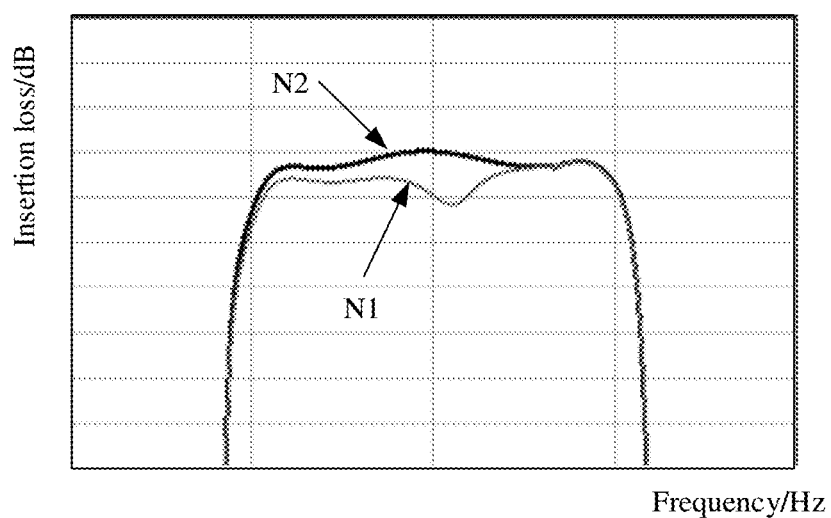
FIG. 15A is a schematic diagram of a comparison between a passband waveform of a filter provided an embodiment of this application and a passband waveform of a conventional filter.

By analogy, referring to a filter 100 shown in FIG. 14, a plurality of filter units similar to the first filter unit 31 are disposed between the input terminal 10 and the output terminal 20 of the filter 100, and each filter unit includes a series resonator disposed on a series branch (for example, the first series resonator 311 on the series branch S in the first filter unit 31 in FIG. 14) and a parallel resonator disposed on a parallel branch (for example, the first parallel resonator 312 on the first parallel branch P1 in FIG. 14). Each of the resonators may be the resonator provided in the foregoing embodiment. Simulation analysis is performed on the filter 100 to obtain a comparison, shown in FIG. 15A, that is between a waveform N2 of a passband part of the filter 100 and a waveform graph N1 of a passband part of a conventional filter, where a horizontal coordinate is a frequency, and a vertical coordinate is an insertion loss. It can be learned that when the series resonator in the filter 100 is the foregoing resonator, a passband of the filter 100 can be effectively improved.

Figure 15B:
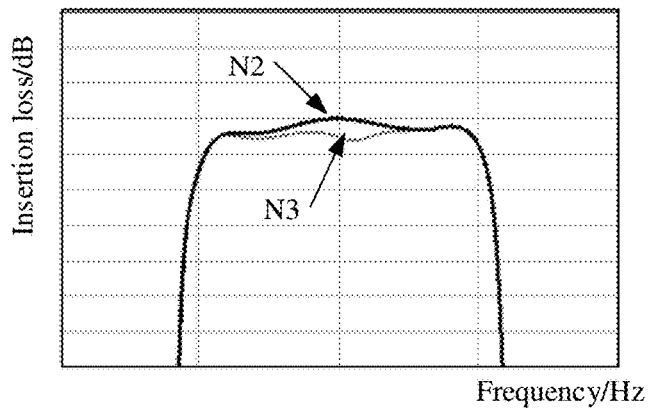
FIG. 15B is a schematic diagram of a comparison between passband waveforms of two filters according to an embodiment of this application.

Certainly, in the filter 100 illustrated in FIG. 14, each of the parallel resonators may also be the resonator provided in the foregoing embodiment, but improvement effect achieved by the resonator is relatively small. Specifically, as shown in FIG. 15B, N2 is a passband waveform obtained when each of the series resonators in the filter is the resonator provided in the foregoing embodiment, and N3 is a passband waveform obtained when each of the parallel resonators in the filter is the resonator provided in the foregoing embodiment. It can be learned that when the parallel resonator is the resonator provided in the foregoing embodiment, effect of improving a passband waveform of the filter is not obvious. Therefore, at least the series resonator in the filter provided in this embodiment of this application is the resonator provided in the foregoing embodiment.

Figure 16:
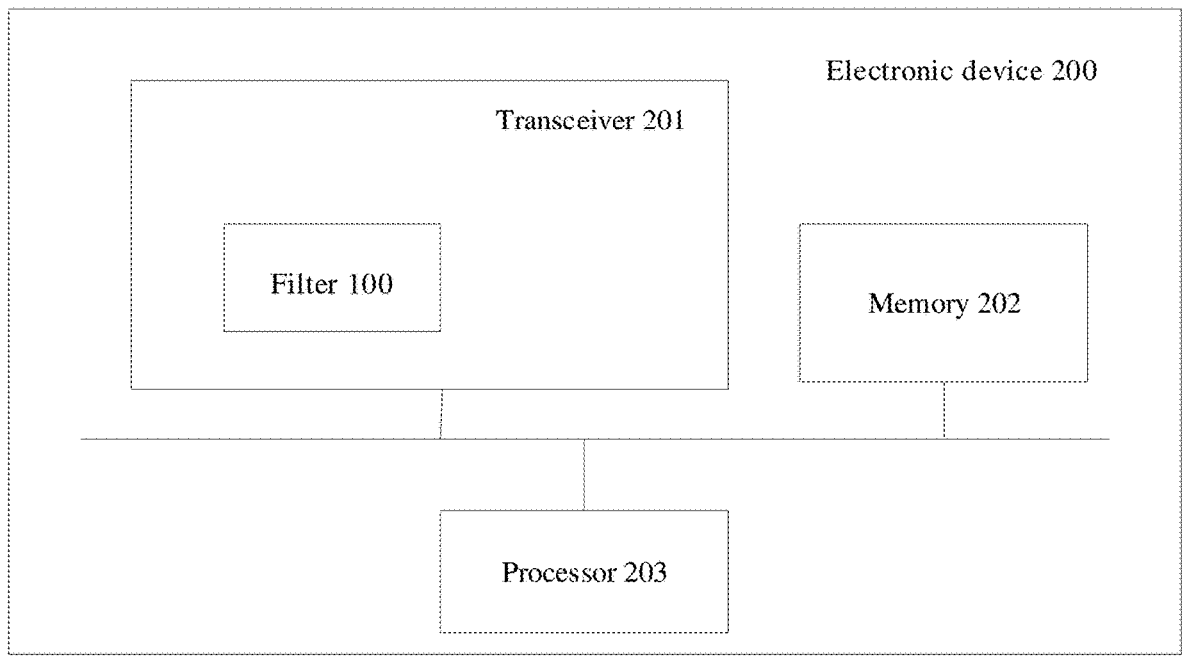
FIG. 16 is a schematic diagram of a structure of an electronic device according to an embodiment of this application.

An embodiment of this application further provides an electronic device 200. Referring to FIG. 16, the electronic device 200 may include a transceiver 201, a memory 202, and a processor 203. The filter 100 is disposed in the transceiver 201 herein. For a structure of the filter 100, refer to one of the structures shown in FIG. 12 to FIG. 14.

Figure 17:
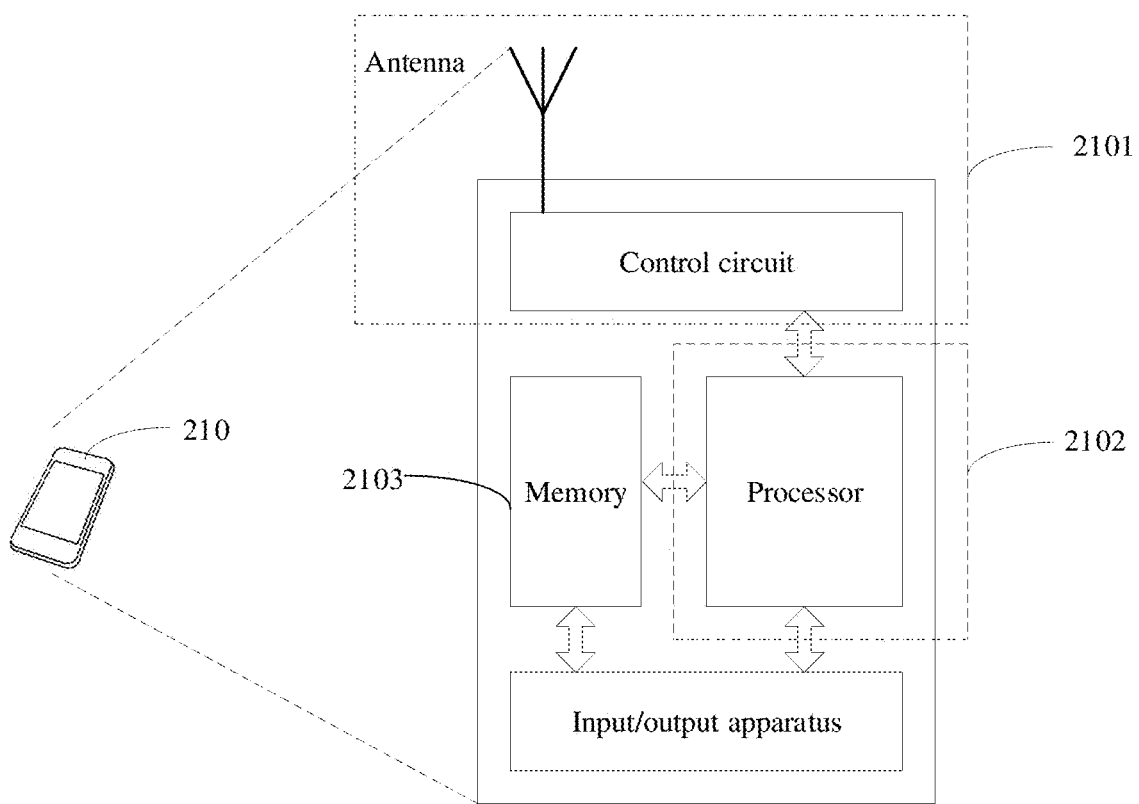
FIG. 17 is a schematic diagram of a structure of a terminal device according to an embodiment of this application.

It should be understood that the electronic device 200 herein may be specifically a terminal device such as a smartphone, a computer, or a smartwatch. A smartphone 210 shown in FIG. 17 is used as an example of the terminal device. The smartphone 210 may specifically include a processor 2102, a memory 2103, a control circuit, an antenna, and an input/output apparatus. The processor 2102 is mainly configured to: process a communication protocol and communication data, control the entire smartphone, execute a software program, and process data of the software program, for example, the processor 2102 is configured to support the smartphone 210 in performing the actions described in the foregoing method embodiment. The memory 2103 is mainly configured to store a software program and data. The control circuit is mainly configured to perform conversion between a baseband signal and a radio frequency signal and process a radio frequency signal, and the control circuit includes the filter 100. The control circuit and the antenna together may also be referred to as a transceiver 2101, which is mainly configured to receive and send a radio frequency signal in a form of an electromagnetic wave. The input/output apparatus, such as a touchscreen, a display, or a keyboard, is mainly configured to receive data input by a user and output data to the user.

After the smartphone 210 is powered on, the processor 2102 may read the software program in the memory 2103, interpret and execute instructions of the software program, and process data of the software program. When data needs to be sent wirelessly, the processor 2102 performs baseband processing on the to-be-sent data, and then outputs a baseband signal to a radio frequency circuit. The radio frequency circuit performs radio frequency processing on the baseband signal, and then sends a radio frequency signal in a form of an electromagnetic wave by using the antenna. When data is sent to the smartphone 210, the radio frequency circuit receives a radio frequency signal by using the antenna, converts the radio frequency signal into a baseband signal, and outputs the baseband signal to the processor 2102, and the processor 2102 converts the baseband signal into data and processes the data.

A person skilled in the art can understand that for ease of description, FIG. 17 shows only one memory and only one processor. In an actual terminal device, there may be a plurality of processors and a plurality of memories. The memory may also be referred to as a storage medium, a storage device, or the like. It should be noted that a type of the memory is not limited in this embodiment of this application.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A resonator, comprising: a substrate, a Bragg reflection layer, and a piezoelectric layer that are sequentially stacked, wherein
   a first electrode is disposed on a surface of the piezoelectric layer that faces the Bragg reflection layer, a second electrode is disposed on a surface of the piezoelectric layer that faces away from the Bragg reflection layer, a border ring is disposed on a surface of the second electrode that faces away from the piezoelectric layer, and the resonator has a first resonance region and a second resonance region corresponding to the border ring; and
   along a stacking direction, the Bragg reflection layer comprises a low acoustic-impedance structure and a first high acoustic-impedance structure embedded in the low acoustic-impedance structure, wherein the first high acoustic-impedance structure comprises a discontinuous structure corresponding to the second resonance region.

2. The resonator according to claim 1, wherein the discontinuous structure overlaps the second resonance region and does not overlap the first resonance region.

3. The resonator according to claim 1, wherein the discontinuous structure comprises a groove extending from a surface of the first high acoustic-impedance structure.

4. The resonator according to claim 1, wherein the discontinuous structure comprises a step disposed on an edge of the first high acoustic-impedance structure; and
   a bottom surface of the step faces the piezoelectric layer, or the bottom surface of the step faces the substrate.

5. The resonator according to claim 4, wherein in a plane perpendicular to the edge, a horizontal size of the step is greater than 200 nm and less than a distance between the edge and the first resonance region, and a vertical size of the step is greater than 20 nm and less than a thickness of the first high acoustic-impedance structure.

6. The resonator according to claim 4, wherein a step is disposed on each of two edges of the first high acoustic-impedance structure; and
   in a plane perpendicular to the edges, the steps have different horizontal sizes, and the steps have a same vertical size.

7. The resonator according to claim 1, wherein the Bragg reflection layer further comprises a second high acoustic-impedance structure embedded in the low acoustic-impedance structure; and
   along the stacking direction, the second high acoustic-impedance structure is parallel to the first high acoustic-impedance structure, and the low acoustic-impedance structure is disposed between the first high acoustic-impedance structure and the second high acoustic-impedance structure.

8. A filter, comprising an input terminal, an output terminal, a series branch, a first parallel branch, and a first filter, wherein
   a first end of the series branch is connected to the input terminal, and a second end of the series branch is connected to the output terminal, and a first end of the first parallel branch is connected to the series branch, and a second end of the first parallel branch is grounded; and
   the first filter comprises a first series resonator disposed on the series branch and a first parallel resonator disposed on the first parallel branch, wherein the first series resonator comprises a structure configured to suppress a border mode harmonic;

wherein the first series resonator comprises a substrate, a Bragg reflection layer, and a piezoelectric layer that are sequentially stacked; a first electrode is disposed on a surface of the piezoelectric layer that faces the Bragg reflection layer, and a second electrode is disposed on a surface of the piezoelectric layer that faces away from the Bragg reflection layer, and a border ring is disposed on a surface of the second electrode that faces away from the piezoelectric layer, in a manner that the first series resonator has a first resonance region and a second resonance region corresponding to the border ring; and along a stacking direction, the Bragg reflection layer comprises a low acoustic-impedance structure and a first high acoustic-impedance structure embedded in the low acoustic-impedance structure, wherein the first high acoustic-impedance structure comprises a discontinuous structure corresponding to the second resonance region.

9. The filter according to claim 8, wherein the discontinuous structure overlaps the second resonance region and does not overlap the first resonance region.

10. The filter according to claim 8, wherein the discontinuous structure comprises a groove extending from a surface of the first high acoustic-impedance structure.

11. The filter according to claim 8, wherein the discontinuous structure comprises a step disposed on an edge of the first high acoustic-impedance structure; and
wherein a bottom surface of the step faces the piezoelectric layer, or the bottom surface of the step faces the substrate.

12. The filter according to claim 8, wherein the first parallel resonator comprises a structure configured to suppress a border mode harmonic.

13. The filter according to claim 8, further comprising a second parallel branch and a second filter, wherein
a first end of the second parallel branch is connected to the series branch, and a second end of the second parallel branch is grounded; and
the second filter comprises a second series resonator connected on the series branch and a second parallel resonator connected on the second parallel branch, wherein the second series resonator comprises a structure configured to suppress a border mode harmonic.

14. An electronic device, comprising:
a transceiver, a memory, and a processor, wherein the transceiver is provided with a filter comprising an input terminal, an output terminal, a series branch, a first parallel branch, and a first filter, wherein:
a first end of the series branch is connected to the input terminal, and a second end of the series branch is connected to the output terminal, and a first end of the first parallel branch is connected to the series branch, and a second end of the first parallel branch is grounded; and
the first filter comprises a first series resonator disposed on the series branch and a first parallel resonator disposed on the first parallel branch, wherein the first series resonator is provided with a structure configured to suppress a border mode harmonic;
wherein the first series resonator comprises a substrate, a Bragg reflection layer, and a piezoelectric layer that are sequentially stacked; a first electrode is disposed on a surface of the piezoelectric layer that faces the Bragg reflection layer, and a second electrode is disposed on a surface of the piezoelectric layer that faces away from the Bragg reflection layer, and a border ring is disposed on a surface of the second electrode that faces away from the piezoelectric layer, in a manner that the first series resonator has a first resonance region and a second resonance region corresponding to the border ring; and along a stacking direction, the Bragg reflection layer comprises a low acoustic-impedance structure and a first high acoustic-impedance structure embedded in the low acoustic-impedance structure, wherein the first high acoustic-impedance structure comprises a discontinuous structure corresponding to the second resonance region.

15. A method for manufacturing a resonator, wherein the resonator has a first resonance region and a second resonance region, and the method comprises:
providing a substrate;
disposing a Bragg reflection layer on the substrate, wherein along a stacking direction, the Bragg reflection layer comprises a low acoustic-impedance structure and a first high acoustic-impedance structure embedded in the low acoustic-impedance structure, and the first high acoustic-impedance structure comprises a discontinuous structure corresponding to the second resonance region;
disposing a piezoelectric layer on a surface of the Bragg reflection layer, wherein a first electrode is disposed on a surface of the piezoelectric layer that faces the Bragg reflection layer, and a second electrode is disposed on a surface of the piezoelectric layer that faces away from the Bragg reflection layer; and
disposing a border ring on a surface of the second electrode that faces away from the piezoelectric layer.

16. The method according to claim 15, wherein disposing the Bragg reflection layer on the substrate comprises:
depositing a low acoustic-impedance material on the substrate to form a first low acoustic-impedance layer;
depositing a high acoustic-impedance material on a surface of the first low acoustic-impedance layer to form the first high acoustic-impedance structure;
patterning the first high acoustic-impedance structure; and
depositing a low acoustic-impedance material on a surface of the first high acoustic-impedance structure to form a second low acoustic-impedance layer, wherein the second low acoustic-impedance layer and the first low acoustic-impedance layer have an integrated structure to form the low acoustic-impedance structure.

17. The method according to claim 16, wherein disposing the Bragg reflection layer on the substrate comprises:
depositing a low acoustic-impedance material on the substrate to form the first low acoustic-impedance layer;
depositing a high acoustic-impedance material on the surface of the first low acoustic-impedance layer to form a first high acoustic-impedance layer;
depositing a low acoustic-impedance material around the first high acoustic-impedance layer, in a manner that the surface of the first low acoustic-impedance layer is flush with a surface of the first high acoustic-impedance layer;
depositing a high acoustic-impedance material on the surfaces of the first low acoustic-impedance layer and the first high acoustic-impedance layer to form a second high acoustic-impedance layer, wherein the second high acoustic-impedance layer and the first high acoustic-impedance layer have an integrated structure to form the first high acoustic-impedance structure; and depositing a low acoustic-impedance material on a surface of the first high acoustic-impedance structure to form the second low acoustic-impedance layer, wherein the second low acoustic-impedance layer and the first low acoustic-impedance layer have an integrated structure to form the low acoustic-impedance structure.

18. The method according to claim 16, wherein patterning the first high acoustic-impedance structure comprises patterning the first high acoustic-impedance structure to form the discontinuous structure.

19. The method according to claim 18, wherein the discontinuous structure comprises a groove extending from a surface of the first high acoustic-impedance structure.

20. The method according to claim 18, wherein the discontinuous structure comprises a step disposed on an edge of the first high acoustic-impedance structure.

* * * * *